(12) United States Patent
Fedorovskaya et al.

(10) Patent No.: US 8,529,990 B2
(45) Date of Patent: *Sep. 10, 2013

(54) PROCESS FOR FORMING THIN FILM ENCAPSULATION LAYERS

(75) Inventors: Elena A. Fedorovskaya, Pittsford, NY (US); Michael L. Boroson, Rochester, NY (US); David H. Levy, Rochester, NY (US); John A. Agostinelli, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/303,513

(22) Filed: Nov. 23, 2011

(65) Prior Publication Data

US 2012/0070942 A1   Mar. 22, 2012

Related U.S. Application Data

(63) Continuation of application No. 11/861,519, filed on Sep. 26, 2007, now abandoned.

(51) Int. Cl.
  *B05D 5/00* (2006.01)
  *B05D 5/12* (2006.01)

(52) U.S. Cl.
  USPC ........................................ 427/160; 427/126.4

(58) Field of Classification Search
  USPC .......................................................... 427/160
  See application file for complete search history.

(56) References Cited

U.S. PATENT DOCUMENTS

| | | | |
|---|---|---|---|
| 4,413,022 A | 11/1983 | Suntola et al. | |
| 6,268,695 B1 | 7/2001 | Affinito | |
| 6,413,645 B1 | 7/2002 | Graff et al. | |
| 6,522,067 B1 | 2/2003 | Graff et al. | |
| 6,746,934 B2 | 6/2004 | Sandhu et al. | 438/428 |

(Continued)

FOREIGN PATENT DOCUMENTS

| | | |
|---|---|---|
| JP | 2003-324070 | 11/2003 |
| WO | WO01/82390 | 11/2001 |

(Continued)

OTHER PUBLICATIONS

Chongmu Lee, et al., "Dependence of the electrical properties of the ZnO thin films grown by atomic layer epitaxy on the reactant feed sequence," J. Vac. Sci. Technol. A 24(4), Jul./Aug. 2006, pp. 1031-1035.

*Primary Examiner* — Michael Cleveland
*Assistant Examiner* — Austin Murata
(74) *Attorney, Agent, or Firm* — William R. Zimmerli

(57) ABSTRACT

A thin film environmental barrier encapsulation process includes providing an electronic device on a substrate, a first reactant gaseous material, a second reactant gaseous material, an inert gaseous material; and a delivery head through which the reactant gaseous materials and the inert gaseous material are simultaneously directed toward the electronic device and the substrate. One or more of the reactant gaseous materials and the inert gaseous material flows through the delivery head. The flow of the one or more of the reactant gaseous materials and the inert gaseous material generates a pressure to create a gas fluid bearing that maintains a substantially uniform distance between the delivery head and the substrate. Relative motion between the delivery head and the substrate causes the second reactant gaseous material to react with at least a portion of the electronic device and the substrate that has been treated with the first reactant gaseous material.

10 Claims, 22 Drawing Sheets

(56) References Cited

U.S. PATENT DOCUMENTS

| | | | |
|---|---|---|---|
| 6,821,563 B2 | 11/2004 | Yudovsky | 427/248.1 |
| 2002/0003403 A1 | 1/2002 | Ghosh et al. | |
| 2003/0143319 A1* | 7/2003 | Park et al. | 427/64 |
| 2004/0065255 A1* | 4/2004 | Yang et al. | 118/715 |
| 2004/0067641 A1 | 4/2004 | Yudovsky | |
| 2005/0084610 A1 | 4/2005 | Selitser | 427/248.1 |
| 2005/0248270 A1 | 11/2005 | Ghosh et al. | |
| 2005/0271812 A1* | 12/2005 | Myo et al. | 427/248.1 |
| 2006/0244107 A1 | 11/2006 | Sugihara et al. | |
| 2007/0099356 A1 | 5/2007 | Park et al. | |
| 2007/0224348 A1 | 9/2007 | Dickey et al. | 427/248.1 |
| 2008/0105370 A1* | 5/2008 | Schaepkens et al. | 156/272.2 |

FOREIGN PATENT DOCUMENTS

| | | |
|---|---|---|
| WO | WO2004/105149 | 12/2004 |
| WO | WO 2008/057180 | 5/2008 |
| WO | WO2008/082472 | 7/2008 |

* cited by examiner

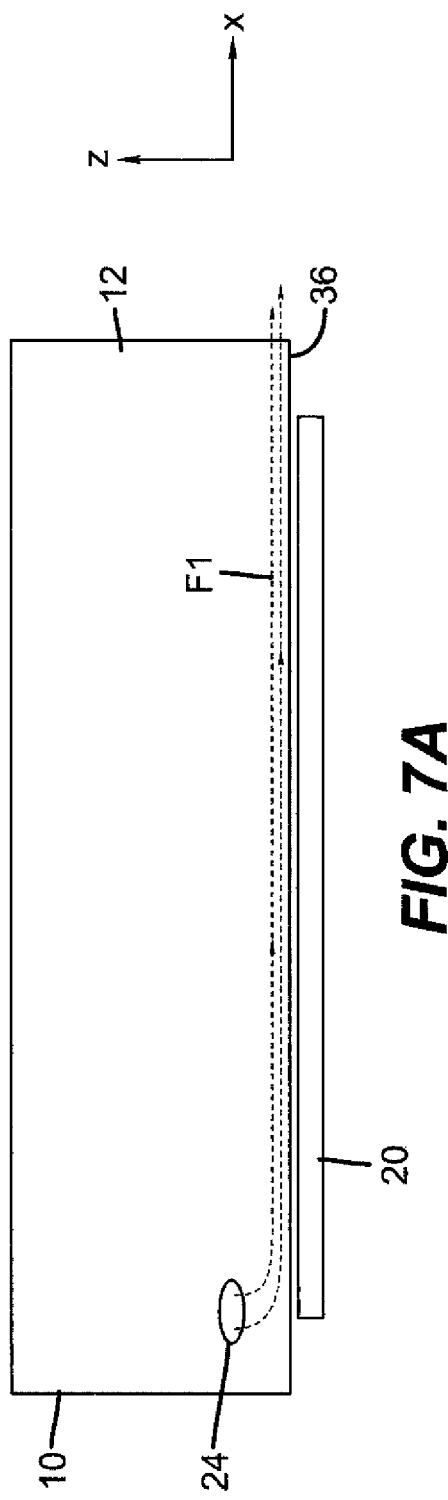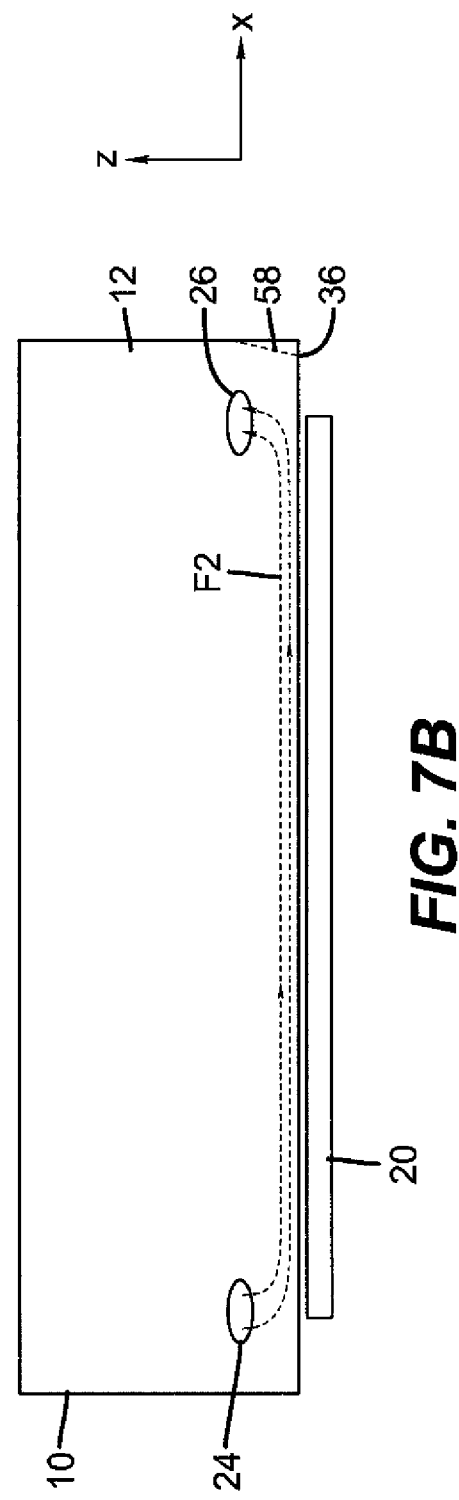

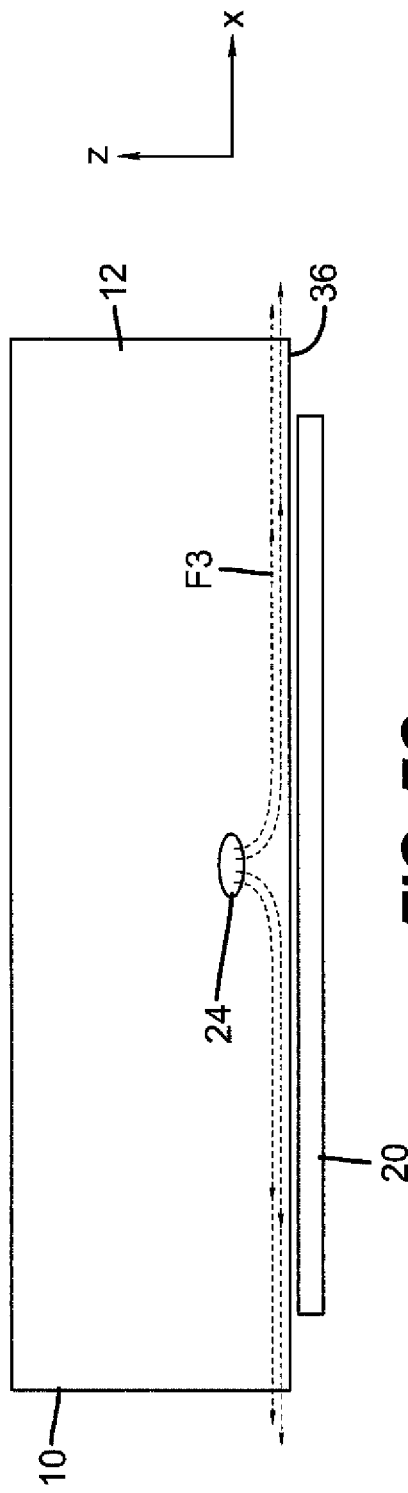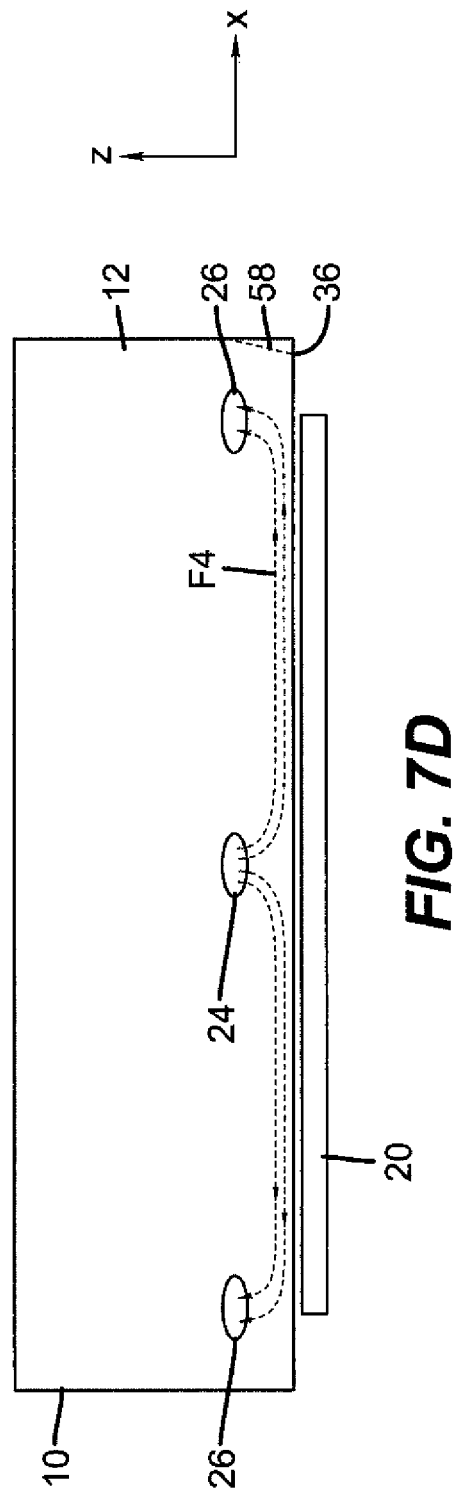

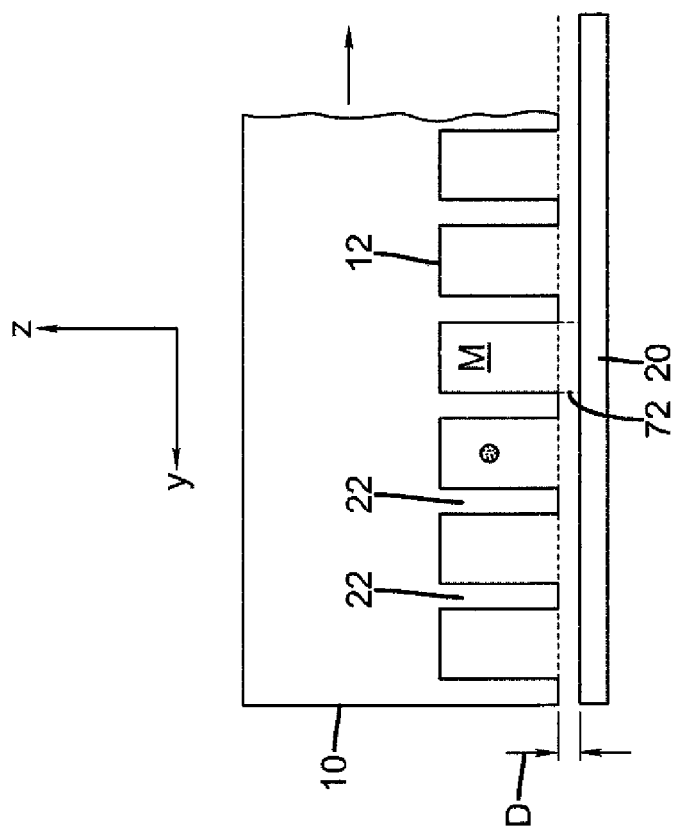
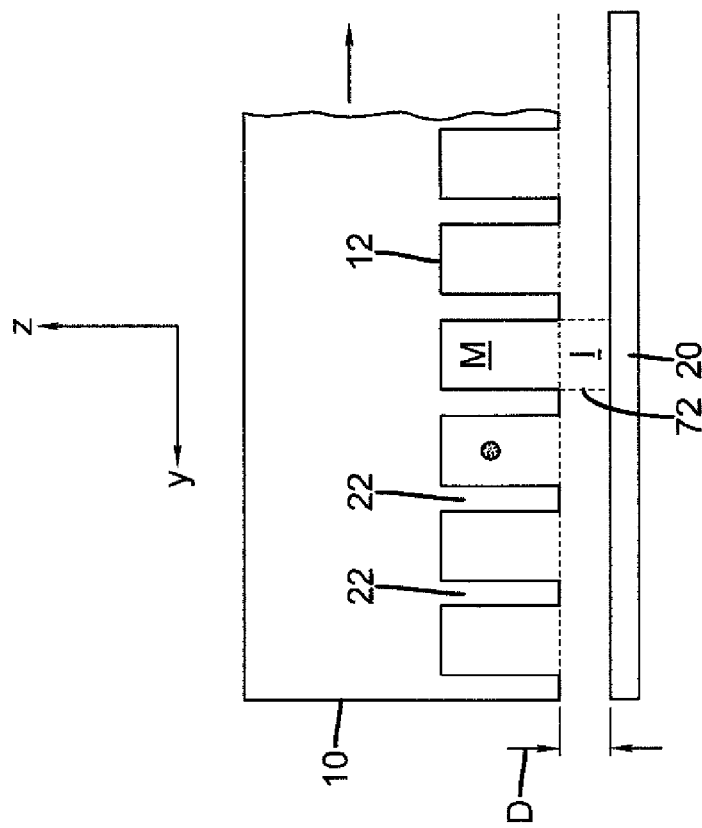

PROCESS FOR FORMING THIN FILM ENCAPSULATION LAYERS

CROSS-REFERENCE TO RELATED APPLICATIONS

This is a continuation application of U.S. patent application Ser. No. 11/861,519 now abandoned filed Sep. 26, 2007.

Reference is made to commonly assigned U.S. patent application Ser. No. 11/616,536 U.S. Pat. No. 7,750,588 filed Dec. 27, 2006, entitled "OLED WITH PROTECTIVE ELECTRODE" by Ronald Steven Cok, U.S. application Ser. No. 11/392,007 U.S. Pat. No. 7,413,982, filed Mar. 29, 2006 by Levy and entitled, "PROCESS FOR ATOMIC LAYER DEPOSITION," U.S. application Ser. No. 11/392,006 U.S. Pat. No. 7,456,429, filed Mar. 29, 2006 by Levy and entitled "APPARATUS FOR ATOMIC LAYER DEPOSITION," U.S. application Ser. No. 11/620,738 now abandoned, filed Jan. 8, 2007 by Levy and entitled "DELIVERY DEVICE FOR DEPOSITION," U.S. application Ser. No. 11/620,740 U.S. Pat. No. 7,789,961, filed Jan. 8, 2007 by Nelson et al. and entitled "DELIVERY DEVICE COMPRISING GAS DIFFUSER FOR THIN FILM DEPOSITION," U.S. application Ser. No. 11/620,744, filed Jan. 8, 2007 by Levy and entitled, "DEPOSITION SYSTEM AND METHOD USING A DELIVERY HEAD SEPARATED FROM A SUBSTRATE BY GAS PRESSURE," U.S. application Ser. No. 11/627,525 U.S. Pat. No. 8,207,063, filed Jan. 26, 2007 by Peter Cowdery-Corvan et al. and entitled, "PROCESS FOR ATOMIC LAYER DEPOSITION," U.S. application Ser. No. 11/861,420 U.S. Pat. No. 8,182,608, filed Sep. 26, 2007 by Kerr et al. and entitled, "DEPOSITION SYSTEM FOR THIN FILM FORMATION," U.S. application Ser. No. 11/861,402 U.S. Pat. No. 8,211,231, filed Sep. 26, 2007 by Kerr et al. and entitled "DELIVERY DEVICE FOR DEPOSITION," U.S. application Ser. No. 11/861,372 U.S. Pat. No. 7,572,686 filed Sep. 26, 2007 by Levy et al. and entitled, "SYSTEM FOR THIN FILM DEPOSITION UTILIZING COMPENSATING FORCES," U.S. application Ser. No. 11/861,359 U.S. Pat. No. 8,398,770, filed Sep. 26, 2007 by Levy et al. and entitled, "DEPOSITION SYSTEM FOR THIN FILM DEPOSITION," and U.S. application Ser. No. 11/861,539 now abandoned, filed Sep. 26, 2007 by Fedorovskaya et al. and entitled, "THIN FILM ENCAPSULATION CONTAINING ZINC OXIDE," All the above-identified applications incorporated by reference in their entirety.

FIELD OF THE INVENTION

This invention generally relates to the deposition of thin-film materials and, more particularly, to a process for atomic layer deposition onto a substrate using a deposition device. In particular, the present invention relates to a process of making films of metal-oxide materials for thin film encapsulation of OLED devices.

BACKGROUND OF THE INVENTION

Organic light-emitting diodes (OLEDs) are a promising technology for flat-panel displays and area illumination lamps. The technology relies upon thin-film layers of organic materials coated upon a substrate. OLED devices generally can have two formats known as small-molecule devices such as disclosed in U.S. Pat. No. 4,476,292 and polymer OLED devices such as disclosed in U.S. Pat. No. 5,247,190. Either type of OLED device may include, in sequence, an anode, an organic EL element, and a cathode. The organic EL element disposed between the anode and the cathode commonly includes an organic hole-transporting layer (HTL), an emissive layer (EL) and an organic electron-transporting layer (ETL). Holes and electrons recombine and emit light in the EL layer. Tang et al. (Appl. Phys. Lett., 51, 913 (1987), Journal of Applied Physics, 65, 3610 (1989) and U.S. Pat. No. 4,769,292) demonstrated highly efficient OLEDs using such a layer structure. Since then, numerous OLEDs with alternative layer structures, including polymeric materials, have been disclosed and device performance has been improved. However, the materials comprising the organic EL element are sensitive and, in particular, are easily destroyed by moisture and high temperatures (for example greater than 140 degrees C.).

Transparent conductive electrodes typically employ sputter-deposited conductive metal oxides such as indium tin oxide. The described sputter deposited electrode layers, as well as underlying layers, typically are not sufficiently impermeable to environmental contaminants when employed as the transparent top electrode in a top-emitting device, necessitating the use of additional encapsulating overcoat layers or sealed transparent glass covers, thereby exacerbating problems with light trapping and/or increased costs for such devices.

It is well known that OLED materials are subject to degradation in the presence of environmental contaminants, in particular moisture. Organic light-emitting diode (OLED) display devices typically require humidity levels below about 1000 parts per million (ppm) to prevent premature degradation of device performance within a specified operating and/or storage life of the device. Control of the environment to this range of humidity levels within a packaged device is typically achieved, as mentioned above, by encapsulating the device with an encapsulating layer and/or by sealing the device, and/or providing a desiccant within a cover. Desiccants such as, for example, metal oxides, alkaline earth metal oxides, sulfates, metal halides, and perchlorates are used to maintain the humidity level below the above-specified level. See, for example, U.S. Pat. No. 6,226,890 issued May 8, 2001 to Boroson et al. describing desiccant materials for moisture-sensitive electronic devices. Such desiccating materials are typically located around the periphery of an OLED device or over the OLED device itself.

In alternative approaches, an OLED device is encapsulated using thin multilayer coatings of moisture-resistant material. For example, layers of inorganic materials such as metals or metal oxides separated by layers of an organic polymer may be used. Such coatings have been described in, for example, U.S. Pat. Nos. 6,268,695; 6,413,645; 6,522,067, and US Patent Publication No. 2006/0246811, the latter reference hereby incorporated by reference in its entirety.

Such encapsulating layers may be deposited by various techniques, including atomic layer deposition (ALD). One such atomic layer deposition apparatus is further described in WO0182390 to Ghosh et al. entitled "THIN FILM ENCAPSULATION OF ORGANIC LIGHT EMITTING DIODE DEVICES" describes the use of first and second thin film encapsulation layers made of different materials wherein one of the thin-film layers is deposited at 50 nm using atomic layer deposition discussed below. According to this disclosure, a separate protective layer is also employed, e.g., parylene. Such thin multi layer coatings typically attempt to provide a moisture permeation rate of less than $5 \times 10^{-6}$ g/m$^2$/day to adequately protect the OLED materials. In contrast, typically polymeric materials have a moisture permeation rate of approximately 0.1 gm/m$^2$/day and cannot adequately protect the OLED materials without additional moisture blocking layers. With the addition of inorganic moisture blocking layers, 0.01 g/m²/day may be achieved and it has been reported that the use of relatively thick polymer smoothing layers with inorganic layers may provide the needed protection. Thick inorganic layers, for example 5 microns or more of ITO or ZnSe, applied by conventional deposition techniques such as sputtering or vacuum evaporation may also provide adequate protection, but thinner conventionally coated layers may only provide protection of 0.01 gm/m²/day. US 2007/0099356 to Park et al. entitled "FLAT PANEL DISPLAY DEVICE AND METHOD OF MANUFACTURING THE SAME" similarly describes a method for thin film encapsulation of flat panel displays using atomic layer deposition.

WO2004105149 TO Carcia et al. entitled "BARRIER FILMS FOR PLASTIC SUBSTRATES FABRICATED BY ATOMIC LAYER DEPOSITION" published Dec. 2, 2004 describes gas permeation barriers that can be deposited on plastic or glass substrates by atomic layer deposition. Atomic Layer Deposition is also known as Atomic Layer Epitaxy (ALE) or atomic layer CVD (ALCVD), and reference to ALD herein is intended to refer to all such equivalent processes. The use of the ALD coatings can reduce permeation by many orders of magnitude at thicknesses of tens of nanometers with low concentrations of coating defects. These thin coatings preserve the flexibility and transparency of the plastic substrate. Such articles are useful in container, electrical, and electronic applications. However, such protective layers also cause additional problems with light trapping in the layers since they may be of lower index than the light-emitting organic layers.

Among the techniques widely used for thin-film deposition is Chemical Vapor Deposition (CVD) that uses chemically reactive molecules that react in a reaction chamber to deposit a desired film on a substrate. Molecular precursors useful for CVD applications comprise elemental (atomic) constituents of the film to be deposited and typically also include additional elements. CVD precursors are volatile molecules that are delivered, in a gaseous phase, to a chamber in order to react at the substrate, forming the thin film thereon. The chemical reaction deposits a thin film with a desired film thickness.

Common to most CVD techniques is the need for application of a well-controlled flux of one or more molecular precursors into the CVD reactor. A substrate is kept at a well-controlled temperature under controlled pressure conditions to promote chemical reaction between these molecular precursors, concurrent with efficient removal of byproducts. Obtaining optimum CVD performance requires the ability to achieve and sustain steady-state conditions of gas flow, temperature, and pressure throughout the process, and the ability to minimize or eliminate transients.

There is interest in utilizing processes for deposition that do not involve the expense associated with vacuum processing. In typical vacuum processing, a large metal chamber and sophisticated vacuum pumping systems are required in order to provide the necessary environment. These items increase the capital cost of systems and preclude the easy use of continuous web based systems.

Various processes for making metal oxide films have been disclosed, both high temperature and low temperature processes, including radio frequency magnetron sputtering or modified reactive planar magnetron sputtering. ALD can be used as a fabrication step for forming a number of types of thin film electronic devices, including semiconductor devices and supporting electronic components such as resistors and capacitors, insulators, bus lines, and other conductive structures. ALD is particularly suited for forming thin layers of metal oxides in the components of electronic devices. General classes of functional materials that can be deposited with ALD include conductors, dielectrics or insulators, and semiconductors.

Advantageously, ALD steps are self-terminating and can deposit precisely one atomic layer when conducted up to or beyond self-termination exposure times. An atomic layer typically ranges from about 0.1 to about 0.5 molecular monolayers, with typical dimensions on the order of no more than a few Angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the complete absence of the other precursor or precursors of the reaction. In practice in any process it is difficult to avoid some direct reaction of the different precursors leading to a small amount of chemical vapor deposition reaction. The goal of any process claiming to perform ALD is to obtain device performance and attributes commensurate with an ALD process while recognizing that a small amount of CVD reaction can be tolerated.

In ALD applications, typically two molecular precursors are introduced into the ALD reactor in separate stages. For example, a metal precursor molecule, $ML_x$, comprises a metal element, M that is bonded to an atomic or molecular ligand, L. For example, M could be, but would not be restricted to, Al, W, Ta, Si, Zn, etc. The metal precursor reacts with the substrate when the substrate surface is prepared to react directly with the molecular precursor. For example, the substrate surface typically is prepared to include hydrogen-containing ligands, AH or the like, that are reactive with the metal precursor. Sulfur (S), oxygen (O), and Nitrogen (N) are some typical A species. The gaseous precursor molecule effectively reacts with all of the ligands on the substrate surface, resulting in deposition of a single atomic layer of the metal:

$$\text{substrate–AH} + ML_x \rightarrow \text{substrate–AML}_{x-1} + HL \tag{1}$$

where HL is a reaction by-product. During the reaction, the initial surface ligands, AH, are consumed, and the surface becomes covered with $AML_{x-1}$ ligands, which cannot further react with metal precursor $ML_x$. Therefore, the reaction self-terminates when all of the initial AH ligands on the surface are replaced with $AML_{x-1}$ species. The reaction stage is typically followed by an inert-gas purge stage that eliminates the excess metal precursor and the HL by-product species from the chamber prior to the separate introduction of the other precursor.

A second molecular precursor then is used to restore the surface reactivity of the substrate towards the metal precursor. This is done, for example, by removing the L ligands and re-depositing AH ligands. In this case, the second precursor typically comprises the desired (usually nonmetallic) element A (i.e., O, N, S), and hydrogen (i.e., $H_2O$, $NH_3$, $H_2S$). The next reaction is as follows:

$$\text{substrate–A–ML} + AH_Y \rightarrow \text{substrate–A–M–AH} + HL \tag{2}$$

This converts the surface back to its AH-covered state. (Here, for the sake of simplicity, the chemical reactions are not balanced.) The desired additional element, A, is incorporated into the film and the undesired ligands, L, are eliminated as volatile by-products. Once again, the reaction consumes the reactive sites (this time, the L terminated sites) and self-terminates when the reactive sites on the substrate are entirely depleted. The second molecular precursor then is removed from the deposition chamber by flowing inert purge-gas in a second purge stage.

In summary, then, an ALD process requires alternating in sequence the flux of chemicals to the substrate. The representative ALD process, as discussed above, is a cycle having four different operational stages:

1. $ML_X$ reaction;
2. $ML_x$ purge;
3. $AH_y$ reaction; and
4. $AH_y$ purge, and then back to stage 1.

This repeated sequence of alternating surface reactions and precursor-removal that restores the substrate surface to its initial reactive state, with intervening purge operations, is a typical ALD deposition cycle. A key feature of ALD operation is the restoration of the substrate to its initial surface chemistry condition. Using this repeated set of steps, a film can be layered onto the substrate in equal metered layers that are all identical in chemical kinetics, deposition per cycle, composition, and thickness.

Self-saturating surface reactions make ALD insensitive to transport non-uniformities, which might otherwise impair surface uniformity, due either to engineering tolerances and the limitations of the flow process or related to surface topography (that is, deposition into three dimensional, high aspect ratio structures). As a general rule, a non-uniform flux of chemicals in a reactive process generally results in different completion times at different areas. However, with ALD, each of the reactions is allowed to complete on the entire substrate surface. Thus, differences in completion kinetics impose no penalty on uniformity. This is because the areas that are first to complete the reaction self-terminate the reaction; other areas are able to continue until the full treated surface undergoes the intended reaction.

Typically, an ALD process deposits about 0.1-0.2 nm of a film in a single ALD cycle (with numbered steps 1 through 4 as listed earlier). A useful and economically feasible cycle time must be achieved in order to provide a uniform film thickness in a range of from about 3 nm to 300 nm for many or most semiconductor applications, and even thicker films for other applications. Industry throughput standards dictate that substrates be processed in 2 minutes to 3 minutes, which means that ALD cycle times must be in a range from about 0.6 seconds to about 6 seconds.

An ALD process must be able to execute this sequencing efficiently and reliably for many cycles in order to allow cost-effective coating of many substrates. In an effort to minimize the time that an ALD reaction needs to reach self-termination, at any given reaction temperature, one approach has been to maximize the flux of chemicals flowing into the ALD reactor, using a so-called "pulsing" process. In the pulsed ALD process, a substrate sits in a chamber and is exposed to the above sequence of gases by allowing a first gas to enter the chamber, followed by a pumping cycle to remove that gas, followed by the introduction of a second gas to the chamber, followed by a pumping cycle to remove the second gas. This sequence can be repeated at any frequency and variations in gas type and/or concentration. The net effect is that the entire chamber experiences a variation in gas composition with time, and thus this type of ALD can be referred to as time dependent ALD. The vast majority of existing ALD processes are time dependent ALD.

In order to maximize the flux of chemicals into the ALD reactor, it is advantageous to introduce the molecular precursors into the ALD reactor with minimum dilution of inert gas and at high pressures. However, these measures work against the need to achieve short cycle times and the rapid removal of these molecular precursors from the ALD reactor. Rapid removal in turn dictates that gas residence time in the ALD reactor be minimized.

Existing ALD approaches have been compromised with the trade-off between the need to shorten reaction times and improve chemical utilization efficiency, and on the other hand, the need to minimize purge-gas residence and chemical removal times. One approach to overcome the inherent limitations of time depended ALD systems is to provide each reactant gas continuously and to move the substrate through each gas in succession. In these systems a relatively constant gas composition exists, but is located to specific areas or spaces of the processing system. Therefore, these systems will be referred to as spatially dependent ALD systems.

For example, U.S. Pat. No. 6,821,563 entitled "GAS DISTRIBUTION SYSTEM FOR CYCLICAL LAYER DEPOSITION" to Yudovsky describes a spatially dependent ALD processing system, under vacuum, having separate gas ports for precursor and purge gases, alternating with vacuum pump ports between each gas port. Each gas port directs its stream of gas vertically downward toward a substrate. The separate gas flows are separated by walls or partitions, with vacuum pumps for evacuating gas on both sides of each gas stream. A lower portion of each partition extends close to the substrate, for example, about 0.5 mm or greater from the substrate surface. In this manner, the lower portions of the partitions are separated from the substrate surface by a distance sufficient to allow the gas streams to flow around the lower portions toward the vacuum ports after the gas streams react with the substrate surface.

A rotary turntable or other transport device is provided for holding one or more substrate wafers. With this arrangement, the substrate is shuttled beneath the different gas streams, effecting ALD deposition thereby. In one embodiment, the substrate is moved in a linear path through a chamber, in which the substrate is passed back and forth a number of times.

Another approach using continuous gas flow spatially dependent ALD is shown in U.S. Pat. No. 4,413,022 entitled "METHOD FOR PERFORMING GROWTH OF COMPOUND THIN FILMS" to Suntola et al. A gas flow array is provided with alternating source gas openings, carrier gas openings, and vacuum exhaust openings. Reciprocating motion of the substrate over the array effects ALD deposition, again, without the need for pulsed operation. In the embodiment of FIGS. 13 and 14, in particular, sequential interactions between a substrate surface and reactive vapors are made by a reciprocating motion of the substrate over a fixed array of source openings. Diffusion barriers are formed by a carrier gas opening between exhaust openings. Suntola et al. state that operation with such an embodiment is possible even at atmospheric pressure, although little or no details of the process, or examples, are provided.

While processes such as those described in the '563 Yudovsky and '022 Suntola et al. patents may avoid some of the difficulties inherent to pulsed gas approaches, these processes have other drawbacks. For example, it would be very difficult to maintain a uniform vacuum at different points in an array and to maintain synchronous gas flow and vacuum at complementary pressures, thus compromising the uniformity of gas flux that is provided to the substrate surface. Neither the gas flow delivery unit of the '563 Yudovsky patent nor the gas flow array of the '022 Suntola et al. patent can be used in closer proximity to the substrate than about 0.5 mm.

U.S. Patent Publication No. 2005/0084610 to Selitser discloses an atmospheric pressure atomic layer chemical vapor deposition process. Selitser states that extraordinary increases in reaction rates are obtained by changing the operating pressure to atmospheric pressure, which will involve orders of magnitude increase in the concentration of reactants, with consequent enhancement of surface reactant rates. The embodiments of Selitser involve separate chambers for each stage of the process, although FIG. 10 shows an embodiment in which chamber walls are removed. A series of separated injectors are spaced around a rotating circular substrate holder track. Each injector incorporates independently operated reactant, purging, and exhaust gas manifolds and controls and acts as one complete mono-layer deposition and reactant purge cycle for each substrate as is passes there under in the process. Little or no specific details of the gas injectors or manifolds are described by Selitser, although it is stated that spacing of the injectors is selected so that cross-contamination from adjacent injectors is prevented by purging gas flows and exhaust manifolds incorporated in each injector.

A spatially dependent ALD process can be accomplished with other apparatus or systems described in more detail in commonly assigned U.S. application Ser. No. 11/392,007 now U.S. Pat. No. 7,413,982, U.S. application Ser. No. 11/392,006 now U.S. Pat. No. 7,456,429, U.S. application Ser. No. 11/620,744, and U.S. application Ser. No. 11/620,740. All these identified applications hereby incorporated by reference in their entirety. These systems attempt to overcome one of the difficult aspects of a spatial ALD system, which is undesired intermixing of the continuously flowing mutually reactive gases. In particular, U.S. application Ser. No. 11/392,007 now U.S. Pat. No. 7,413,982 employs a novel transverse flow pattern to prevent intermixing, while U.S. application Ser. No. 11/620,744 and U.S. application Ser. No. 11/620,740 now U.S. Pat. No. 7,789,961 employ a coating head partially levitated by the pressure of the reactive gases of the process to accomplish improved gas separation.

Despite the usefulness and ease of use of these spatially dependent ALD systems, they continue to be less capable than time dependent ALD systems in terms of separation of the mutually reactive gases. Thus, to render them industrially useful, chemistries must be considered that are more robust to avoid problems associated with gas intermixing.

Thus, there remains still a need to provide a spatially dependent ALD system to make metal-oxide thin film encapsulating films.

SUMMARY OF THE INVENTION

The present invention relates to a process of making a thin film encapsulation package for an OLED device by depositing a thin film material on an OLED device to be encapsulated, comprising simultaneously directing a series of gas flows along substantially parallel elongated output openings, wherein the series of gas flows comprises, in order, at least a first reactive gaseous material, an inert purge gas, and a second reactive gaseous material, optionally repeated a plurality of times, wherein the first reactive gaseous material is capable of reacting with a substrate surface treated with the second reactive gaseous material to form an encapsulating thin film, wherein the first reactive gaseous material is a volatile organo-metal precursor compound, wherein the process is carried out substantially at or above atmospheric pressure, and wherein the temperature of the substrate during deposition is under 250° C.

During the process, the substrate or deposition device for the gaseous materials, or both, is capable of providing relative movement between the output face of the deposition device and the substrate while maintaining close proximity.

In a preferred embodiment, the process can be operated with continuous movement of a substrate being subjected to thin film deposition, wherein the process is capable of conveying the support on or as a web past the deposition device, preferably in an unsealed environment to ambient at substantially atmospheric pressure.

It is an advantage of the present invention that it provides an advantageous process for atomic layer deposition of a metal-oxide-based layers onto a substrate, well suited to a number of different types of substrates and deposition environments.

It is yet a further advantage of the present invention that it is adaptable for deposition on a web or other moving substrate, including deposition onto a large area substrate.

It is a further advantage of the present invention that it allows operation, in preferred embodiments, under atmospheric pressure conditions.

It is still a further advantage of the present invention that it can be employed in low temperature processes at atmospheric pressures, which processes may be practice in an unsealed environment, open to ambient atmosphere.

Another aspect of the present invention relates to a process of encapsulating an electronic device with a thin film. An electronic device is provided on a substrate. A plurality of gaseous material sources including a first source of a first reactant gaseous material, a second source of a second reactant gaseous material, and a third source of a inert gaseous material are provided. A delivery head is provided in fluid communication with the gaseous material sources through a plurality of inlet ports. The first gaseous material source is connected to a first inlet port. The second gaseous material source is connected to a second inlet port. The third gaseous material source is connected to a third inlet port. The delivery head includes an output face and a first plurality of elongated substantially parallel emissive channels connected in fluid communication with the first inlet port. A second plurality of elongated substantially parallel emissive channels is connected to the second inlet port. A third plurality of elongated substantially parallel emissive channels connected to the third inlet port. At least one of the third elongated emissive channels is positioned to separate at least one of the first elongated emissive channels and at least one of the second elongated emissive channels. One or more of the first reactant gaseous material, the second reactant gaseous material, and the inert gaseous material is caused to flow through the first elongated emissive channel, the second elongated emissive channel, and the third elongated emissive channel, respectively, of the delivery head. The flow includes a pressure. The pressure generated by the flow of the one or more of the first reactant gaseous material, the second reactant gaseous material, and the third inert gaseous materials creates a gas fluid bearing that maintains a substantially uniform distance between the output face of the delivery head and the substrate. The first reactant gaseous material, the second reactant gaseous material, and the inert gaseous material are simultaneously directed to flow through the first elongated emissive channel, the second elongated emissive channel, and the third elongated emissive channel, respectively, of the delivery head toward the electronic device and the substrate. A relative motion caused between the delivery head and the substrate causes the second reactant gaseous material to react with at least a portion of the electronic device and a portion of the substrate that has been treated with the first reactant gaseous material to create a thin film encapsulation package. The thin film encapsulation package includes a thin film over at least one of the portion of the electronic device and the portion of the substrate that has been treated with the first reactant gaseous material to provide at least the electronic device with an environmental barrier layer.

The objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

FIGS. 7A, 7B, 7C, and 7D are cross-sectional views taken orthogonally to the cross-sectional views of previous FIGS. 2-4B, showing gas flow directions for output channels in various embodiments;

FIGS. 8A and 8B are cross-sectional views showing the impact of reduced distance from the output face, of a deposition device for providing gaseous materials, to the substrate surface;

DETAILED DESCRIPTION OF THE INVENTION

Figure 1:
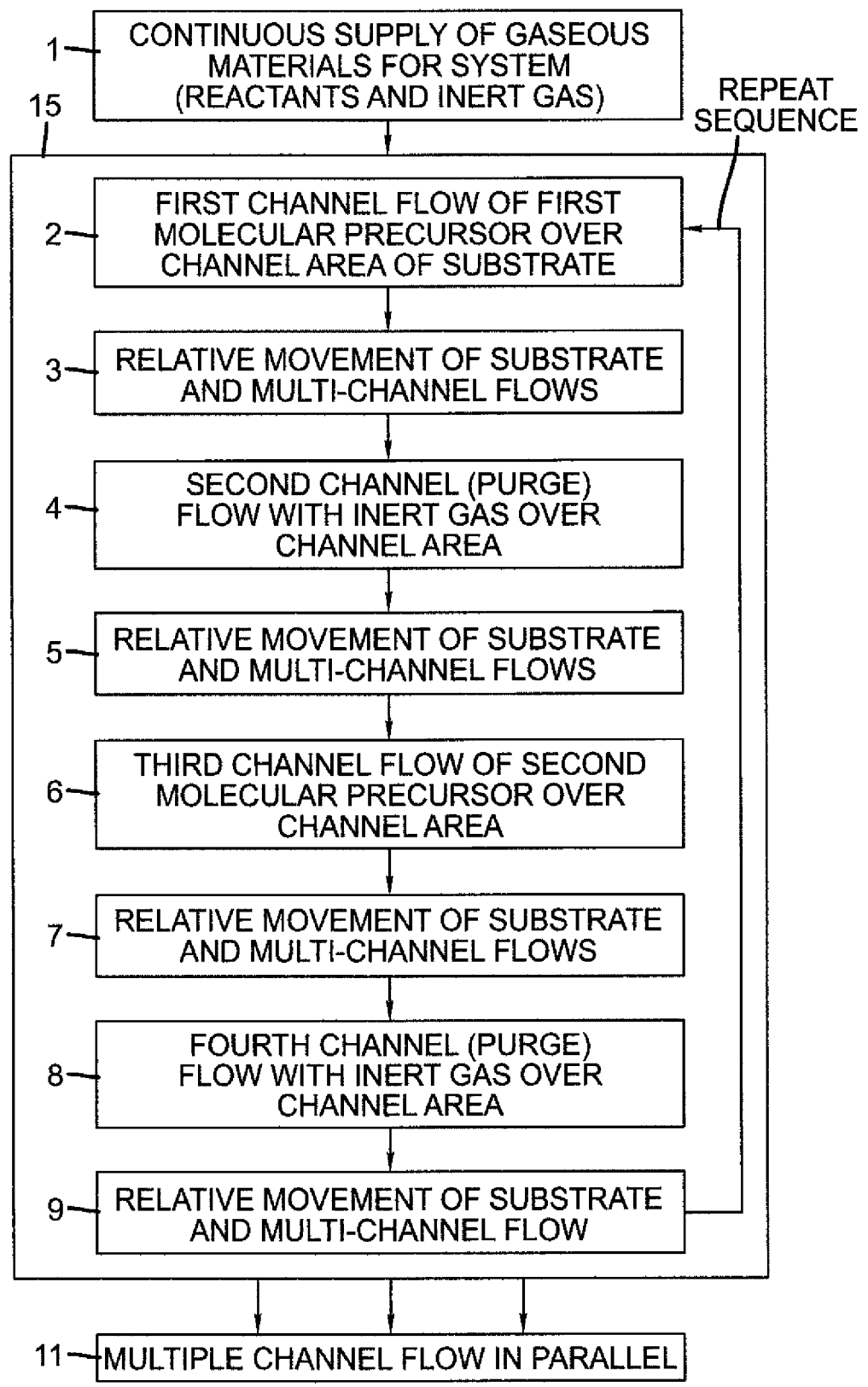
FIG. 1 is a flow chart describing the steps of the present process.

As indicated above, the present process is directed to making a thin film encapsulation package for an OLED device by depositing a thin film material on an OLED device to be encapsulated with at least one encapsulating thin film.

In one embodiment, the encapsulation package can comprise a single layer of a single inorganic compound. In another preferred embodiment, the thin film encapsulation package comprises either (a) at least one first layer of a first inorganic compound and at least one second layer of a second inorganic compound, or (b) a layer that is a mixture of a first inorganic compound and a second inorganic compound. The first inorganic compound and the second inorganic compound can be independently selected from an oxide, nitride, sulfide and phosphide. Preferably, at least one of the first and second compound is an oxide or nitride, and more preferably at least one of the first and the second inorganic compound is aluminum oxide. More generally, the first and second inorganic compound can independently comprise an element that is independently selected from elements in Group 3A, 3B, 4A, and 4B of the Periodic Table. In a particularly preferred embodiment, the first and second inorganic compound comprises an element that is independently selected from the group consisting of zinc, aluminum, titanium, hafnium, silicon, zirconium, yttrium, and indium and there are a plurality of first encapsulating thin films and/or plurality of second encapsulating thin films in which the first and second encapsulating thin films alternate in a stack.

Volatile compounds are defined as compounds that can exist to some extent in the vapor phase at room temperature, so that they may be delivered to a reaction chamber in the form of a gas. In order for such a gas to contain sufficient volatile materials to usefully affect the deposition process, the volatile compound must have a vapor pressure at room temperature of greater than 0.1 mmHg, preferably greater than 1 mmHg. Such dopants are preferably present in the final semiconductor in the amount of 0.001% to 5%, more preferably 0.01% to 1%.

For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art. The figures provided are not drawn to scale but are intended to show overall function and the structural arrangement of some embodiments of the present invention.

The process of the present invention offers a significant departure from conventional approaches to ALD, employing a system for delivery of gaseous materials to a substrate surface that can be adaptable to deposition on larger and web-based substrates and capable of achieving a highly uniform thin-film deposition at improved throughput speeds. The process of the present invention employs a continuous spatially dependent ALD (as opposed to pulsed or time dependent ALD) gaseous material distribution. The process of the present invention allows operation at atmospheric or near-atmospheric pressures and is capable of operating in an unsealed or open-air environment.

FIG. 1 is a generalized step diagram of one embodiment of a process for making a film of an encapsulation layer according to an embodiment of the present invention, in which two reactive gases are used, a first molecular precursor and a second molecular precursor. Gases are supplied from a gas source and can be delivered to the substrate, for example, via a deposition device. Metering and valving apparatus for providing gaseous materials to the a deposition device can be used.

As shown in Step 1, a continuous supply of gaseous materials for the system is provided for depositing a thin film of material on a substrate. The Steps in Sequence 15 are sequentially applied. In Step 2, with respect to a given area of the substrate (referred to as the channel area), a first molecular precursor or reactive gaseous material is directed to flow in a first channel over the channel area of the substrate and reacts therewith. In Step 3 relative movement of the substrate and the multi-channel flows in the system occurs, which sets the stage for Step 4, in which second channel (purge) flow with inert gas occurs over the given channel area. Then, in Step 5, relative movement of the substrate and the multi-channel flows sets the stage for Step 6, in which the given channel area is subjected to atomic layer deposition in which a second molecular precursor now (in this particular embodiment, transversely and substantially parallel to the surface of the substrate) over the given channel area of the substrate and reacts with the previous layer on the substrate to produce (theoretically) a monolayer of a desired material.

In Step 7, relative movement of the substrate and the multi-channel flows then sets the stage for Step 8 in which again an inert gas is used, this time to sweep excess second molecular precursor from the given channel area from the previous Step 6. In Step 9, relative movement of the substrate and the multi-channels occurs again, which sets the stage for a repeat sequence, back to Step 2. The cycle is repeated as many times as is necessary to establish a desired film. In the present embodiment of the process, the steps are repeated with respect to a given channel area of the substrate, corresponding to the area covered by a flow channel. Meanwhile the various channels are being supplied with the necessary gaseous materials in Step 1. Simultaneous with the sequence of box 15 in FIG. 1, other adjacent channel areas are being processed, which results in Multiple channel flows in parallel, as indicated in overall Step 11. Parallel flow can be either substantially orthogonal or substantially parallel to the output face of the deposition device.

The primary purpose of the second molecular precursor is to condition the substrate surface back toward reactivity with the first molecular precursor. The second molecular precursor also provides material from the molecular gas to combine with metal at the surface, forming an oxide with the freshly deposited metal-containing precursor.

This particular embodiment does not need to use a vacuum purge to remove a molecular precursor after applying it to the substrate. Purge steps are expected by most researchers to be the most significant throughput-limiting step in ALD processes.

Assuming that, for the two reactant gases in FIG. 1, AX and BY are used, for example. When the reaction gas AX flow is supplied and flowed over a given substrate area, atoms of the reaction gas AX are chemically adsorbed on a substrate, resulting in a layer of A and a surface of ligand X (associative chemisorptions) (Step 2). Then, the remaining reaction gas AX is purged with an inert gas (Step 4). Then, the flow of reaction gas BY, and a chemical reaction between AX (surface) and BY (gas) occurs, resulting in a molecular layer of AB on the substrate (dissociative chemisorptions) (Step 6). The remaining gas BY and by-products of the reaction are purged (Step 8). The thickness of the thin film can be increased by repeating the process cycle (steps 2-9) many times.

Because the film can be deposited one monolayer at a time it tends to be conformal and have uniform thickness.

It will be apparent to the skilled artisan that alloys of two, three, or more metals may be deposited, compounds may be deposited with two, three, or more constituents, and such things as graded films and nano-laminates may be produced as well.

These variations are simply variants using particular embodiments of the invention in alternating cycles. There are many other variations within the spirit and scope of the invention, so the invention is limited only by the claims that follow.

For various volatile metal-containing precursors, precursor combinations, and reactants useful in ALD thin film processes, reference is made to the Handbook of *Thin Film Process Technology*, Vol. 1, edited by Glocker and Shah, Institute of Physics (IOP) Publishing, Philadelphia 1995, pages B1.5:1 to B1.5:16, hereby incorporated by reference; and *Handbook of Thin Film Materials*, edited by Nalwa, Vol. 1, pages 103 to 159, hereby incorporated by reference, including Table V1.5.1 of the former reference.

Although oxide substrates provide groups for ALD deposition, plastic substrates can be used by suitable surface treatment.

Figure 2:
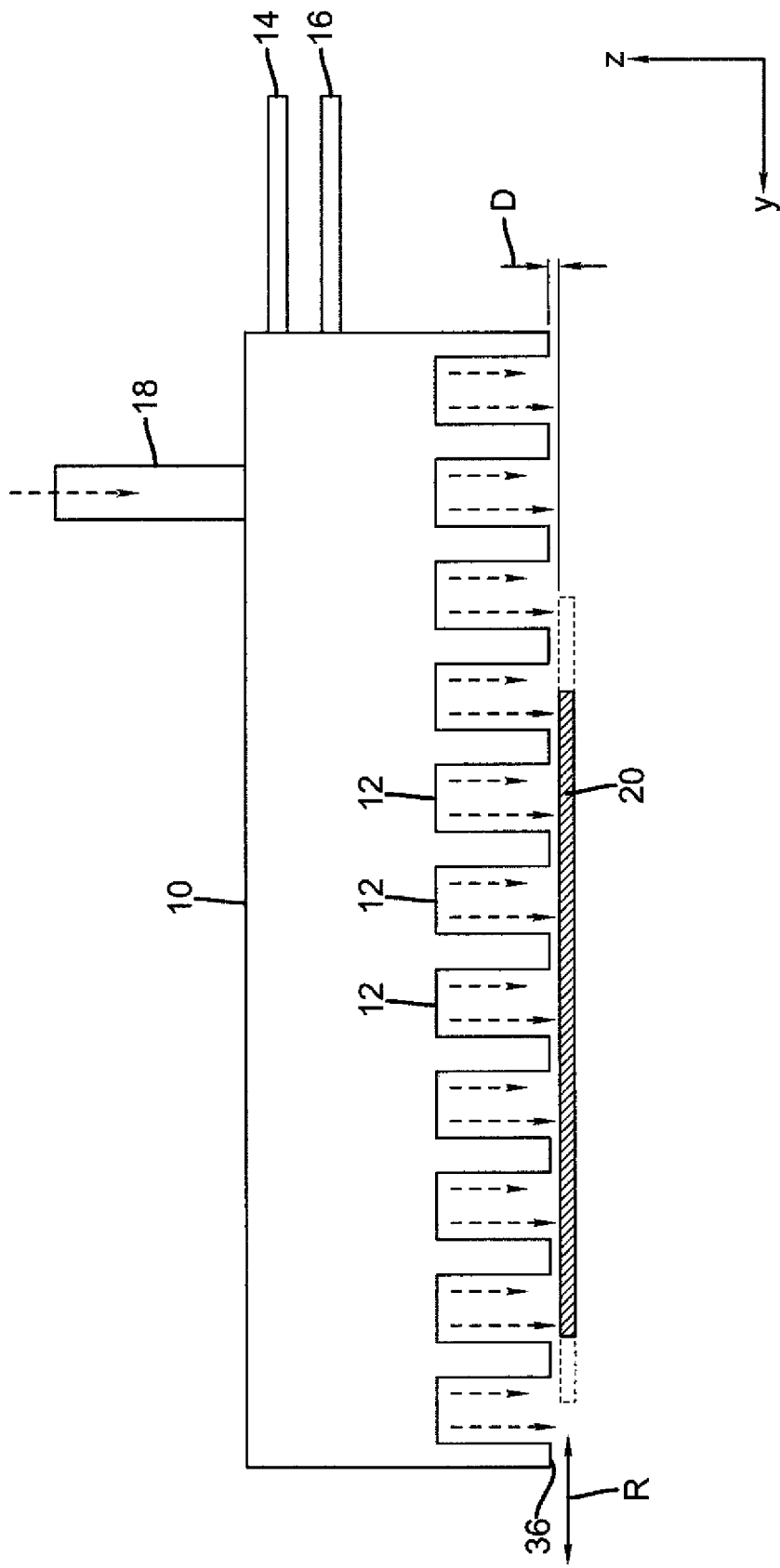
FIG. 2 is a cross-sectional side view of one embodiment of a deposition device for atomic layer deposition that can be used in the present process.

Referring now to FIG. 2, there is shown a cross-sectional side view of one embodiment of a deposition device 10 that can be used in the present process for atomic layer deposition of an encapsulating thin film onto a substrate 20 according to the present invention. Deposition device 10 has a gas inlet port 14 for accepting a first gaseous material, a gas inlet port 16 for accepting a second gaseous material, and a gas inlet port 18 for accepting a third gaseous material. These gases are emitted at an output face 36 via output channels 12, having a structural arrangement described subsequently. The arrows in FIG. 2 and subsequent FIGS. 3-4B refer to the diffusive transport of the gaseous material, and not the flow, received from an output channel. In this particular embodiment, the flow is substantially directed out of the page of the figure, as described further below.

In one embodiment, gas inlet ports 14 and 16 are adapted to accept first and second gases that react sequentially on the substrate surface to effect ALD deposition, and gas inlet port 18 receives a purge gas that is inert with respect to the first and second gases. Deposition device 10 is spaced a distance D from substrate 20, provided on a substrate support, as described in more detail subsequently. Reciprocating motion can be provided between substrate 20 and deposition device 10, either by movement of substrate 20, by movement of deposition device 10, or by movement of both substrate 20 and deposition device 10. In the particular embodiment shown in FIG. 2, substrate 20 is moved across output face 36 in reciprocating fashion, as indicated by the arrow R and by phantom outlines to the right and left of substrate 20 in FIG. 2. It should be noted that reciprocating motion is not always required for thin-film deposition using deposition device 10. Other types of relative motion between substrate 20 and deposition device 10 could also be provided, such as movement of either substrate 20 or deposition device 10 in one or more directions, as described in more detail subsequently.

Figure 3:
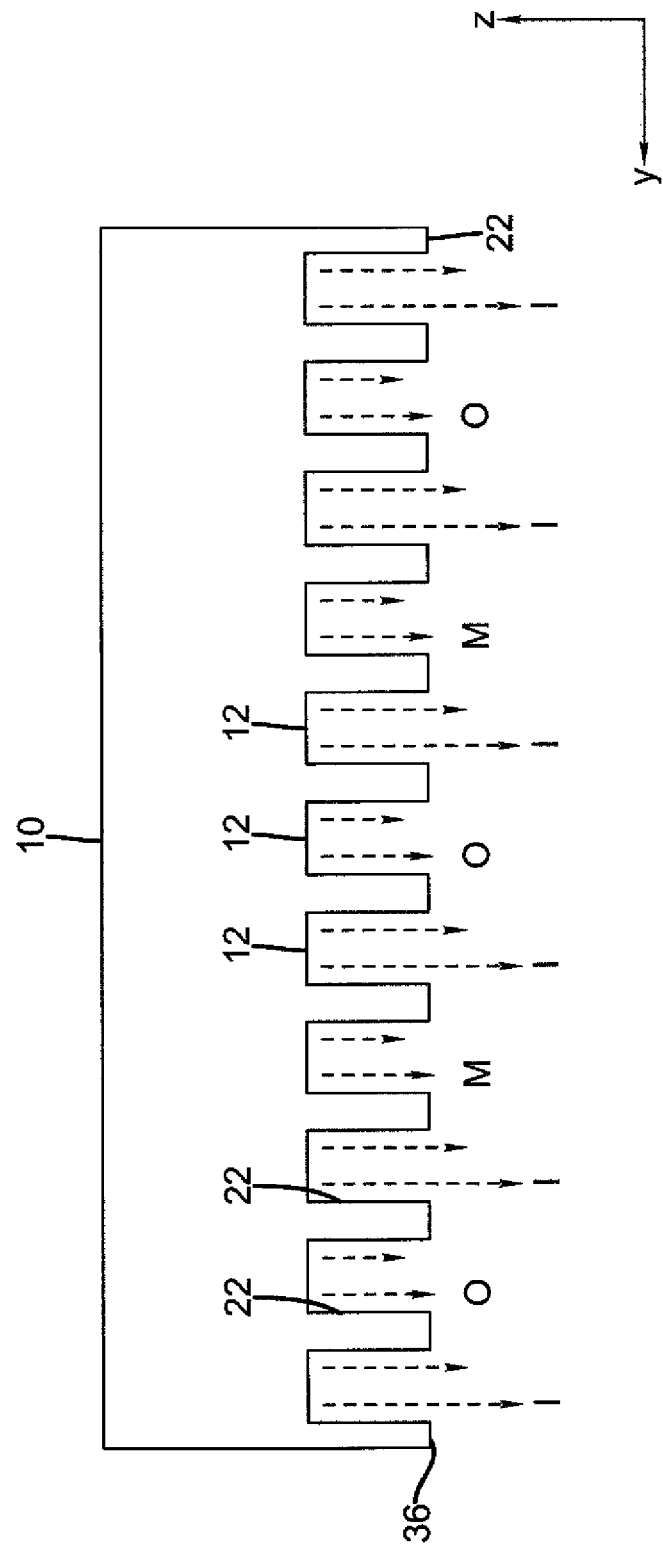
FIG. 3 is a cross-sectional side view of an embodiment, for one exemplary system of gaseous materials, of the distribution of gaseous materials to a substrate that is subjected to thin film deposition.

The cross-sectional view of FIG. 3 shows gas flows emitted over a portion of output face 36 of deposition device 10. In this particular arrangement, each output channel 12, separated by partitions 22, is in gaseous flow communication with one of gas inlet ports 14, 16 or 18 seen in FIG. 2. Each output channel 12 delivers typically a first reactant gaseous material O, or a second reactant gaseous material M, or a third inert gaseous material I.

FIG. 3 shows a relatively basic or simple arrangement of gases. It is envisioned that a plurality of non-metal deposition precursors (like material O) or a plurality of metal-containing precursor materials (like material M) may be delivered sequentially at various ports in a thin-film single deposition. Alternately, a mixture of reactant gases, for example, a mixture of metal precursor materials or a mixture of metal and non-metal precursors may be applied at a single output channel when making complex thin film materials, for example, having alternate layers of metals or having lesser amounts of dopants admixed in a metal oxide material. The inter-stream labeled I separates any reactant channels in which the gases are likely to react with each other. First and second reactant gaseous materials O and M react with each other to effect ALD deposition, but neither reactant gaseous material O nor M reacts with inert gaseous material I. The nomenclature used in FIG. 3 and following suggests some typical types of reactant gases. For example, first reactant gaseous material O could be an oxidizing gaseous material; second reactant gaseous material M could be a metal-containing compound. Inert gaseous material I could be nitrogen, argon, helium, or other gases commonly used as purge gases in ALD processes. Inert gaseous material I is inert with respect to first or second reactant gaseous materials O and M. Reaction between first and second reactant gaseous materials could form a metal oxide or other binary compound. Reactions between more than two reactant gaseous materials could form a ternary compound, for example, ZnAlO.

Figure 4A:
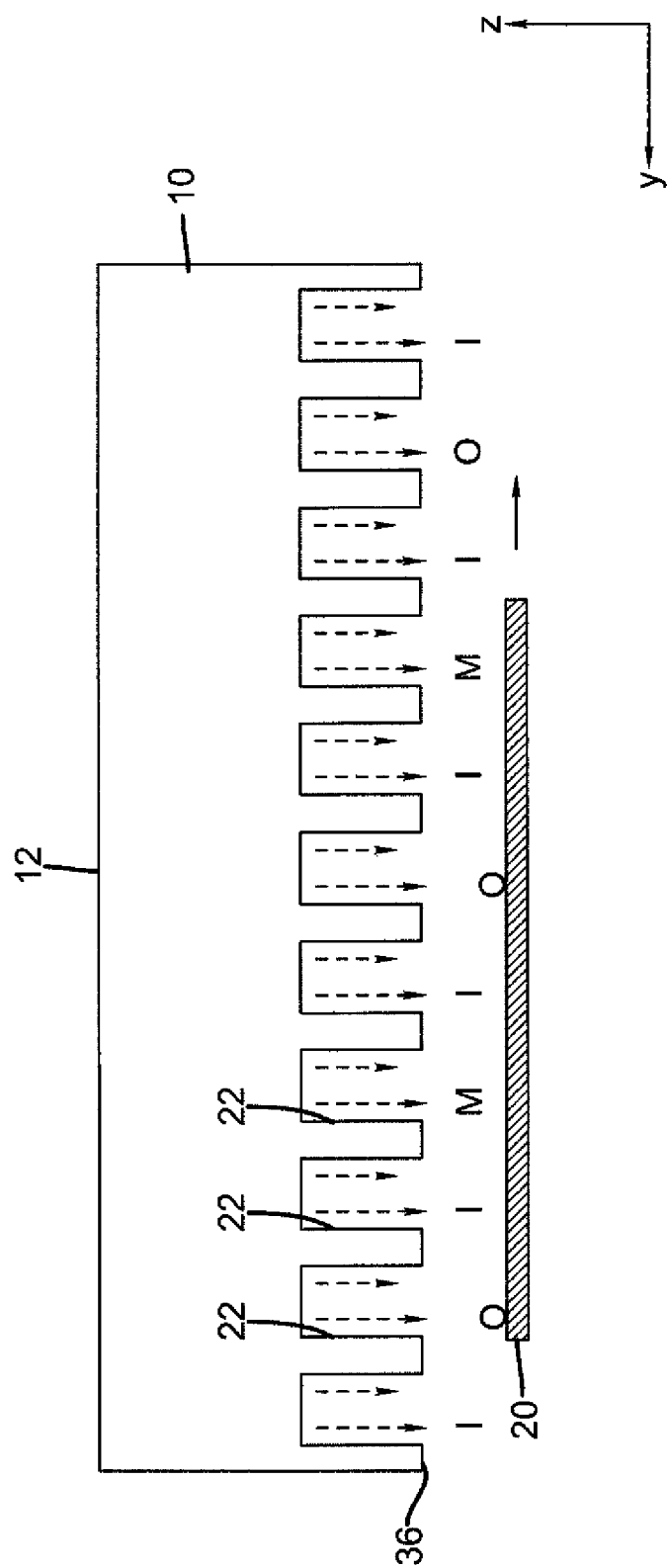
FIGS. 4A and 4B are cross-sectional side views of one embodiment of the distribution of a system of gaseous materials, schematically showing the accompanying deposition operation.
Figure 4B:
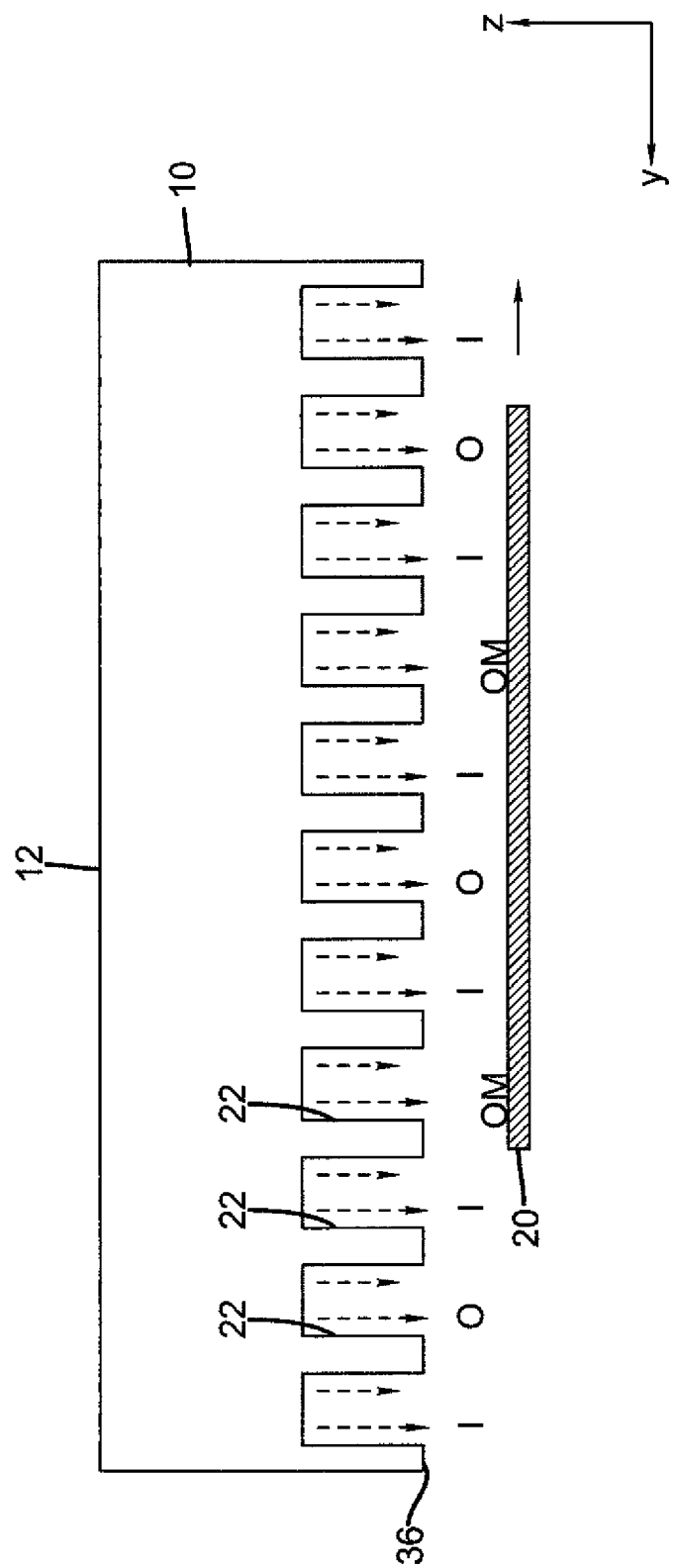

The cross-sectional views of FIGS. 4A and 4B show, in simplified schematic form, the ALD coating operation performed as substrate 20 passes along output face 36 of deposition device 10 when delivering reactant gaseous materials O and M. In FIG. 4A, the surface of substrate 20 first receives an oxidizing material from output channels 12 designated as delivering first reactant gaseous material O. The surface of the substrate now contains a partially reacted form of material O, which is susceptible to reaction with material M. Then, as substrate 20 passes into the path of the metal compound of second reactant gaseous material M, the reaction with M takes place, forming a metallic oxide or some other thin film material that can be formed from two reactant gaseous materials.

As FIGS. 4A and 4B show, inert gaseous material I is provided in every alternate output channel 12, between the flows of first and second reactant gaseous materials O and M. Sequential output channels 12 are adjacent, that is, share a common boundary, formed by partitions 22 in the embodiments shown. Here, output channels 12 are defined and separated from each other by partitions 22 that extend at a perpendicular to the surface of substrate 20.

As mentioned above, in this particular embodiment, there are no vacuum channels interspersed between the output channels 12, that is, no vacuum channels on either side of a channel delivering gaseous materials to drawn the gaseous materials around the partitions. This advantageous, compact arrangement is possible because of the innovative gas flow that is used. Unlike gas delivery arrays of earlier processes that apply substantially vertical (that is, perpendicular) gas flows against the substrate and must then draw off spent gases in the opposite vertical direction, deposition device 10 directs a gas flow (preferably substantially laminar in one embodiment) along the surface for each reactant and inert gas and handles spent gases and reaction by-products in a different manner, as described subsequently. The gas flow used in the present invention is directed along and generally parallel to the plane of the substrate surface. In other words, the flow of gases is substantially transverse to the plane of a substrate rather than perpendicular to the substrate being treated.

Figure 5:
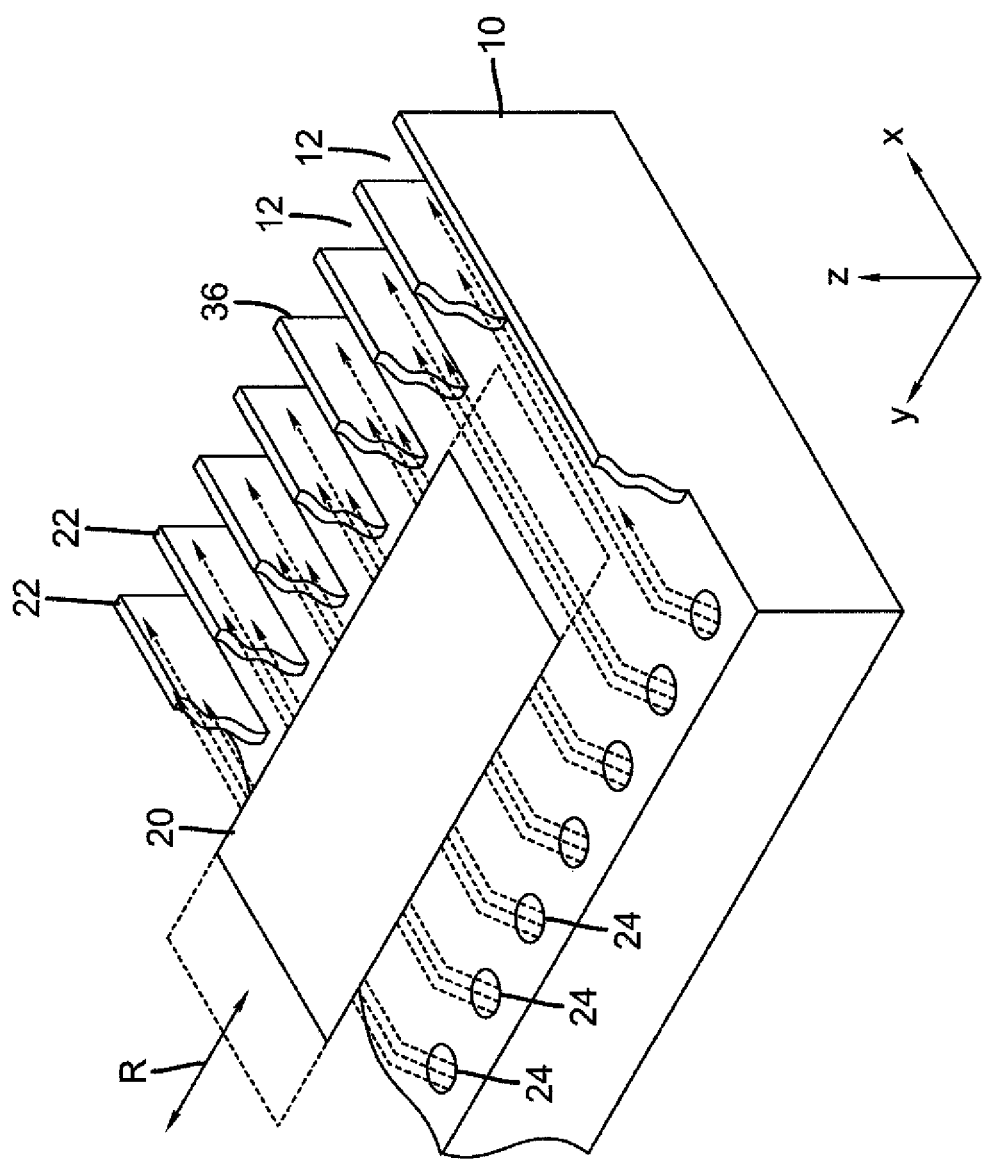
FIG. 5 is a perspective view, from the output face side, of a portion of one embodiment of a deposition device, showing the orientation of output channels relative to the substrate and reciprocating motion, that can be used for deposition on the substrate.
Figure 6:
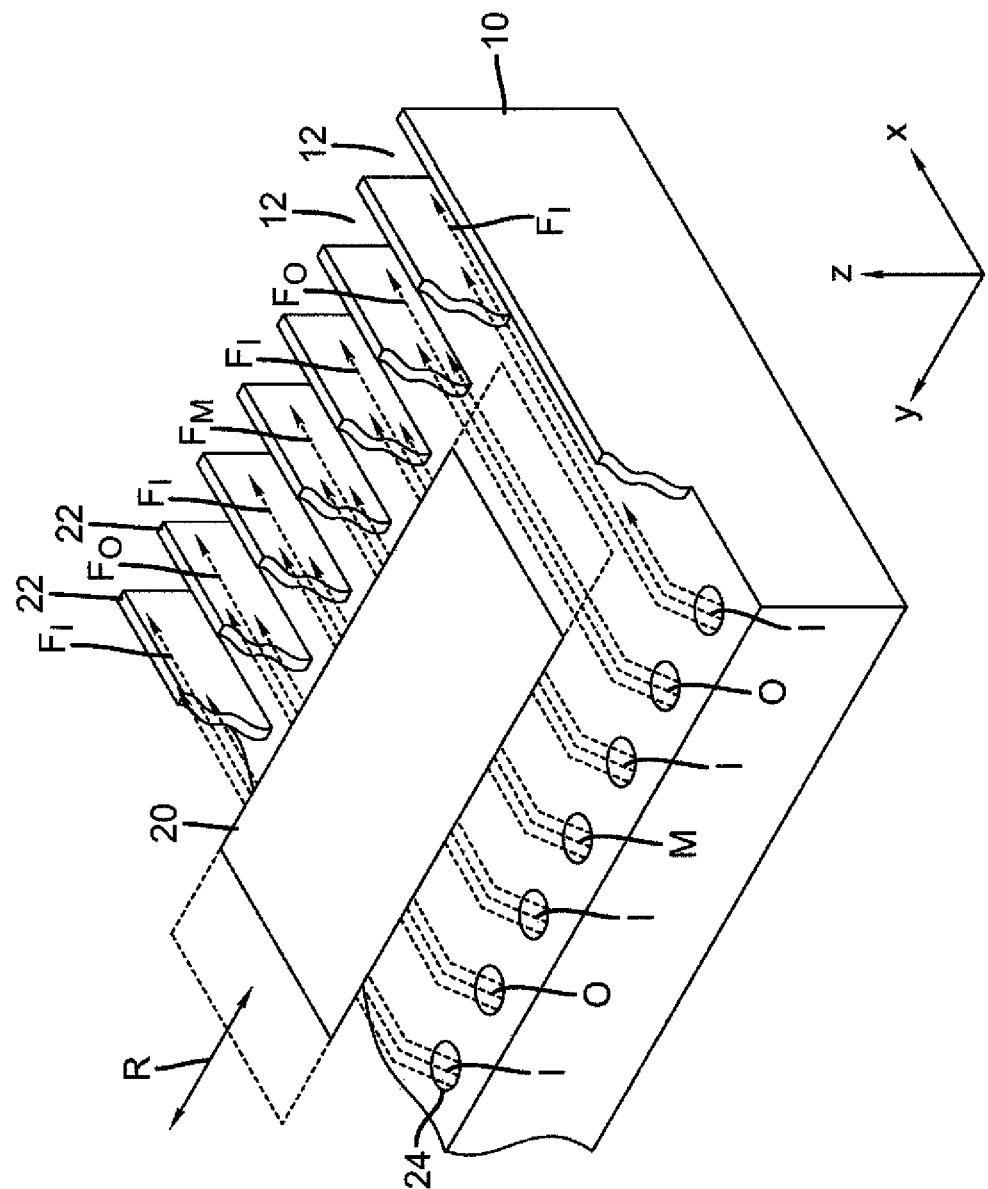
FIG. 6 is a perspective view as in FIG. 5, showing one exemplary arrangement of gas flow in the deposition device.

FIGS. 5 and 6 show perspective views of one embodiment of a deposition device 10 that can be used in the present process, from the output face 36 (that is, from the underside with respect to FIGS. 2-4B). Partitions 22 that define and separate the adjacent output channels 12 in this embodiment are represented as partially cut away, to allow better visibility for the gas flows flowing from gas outlet ports 24. FIGS. 5 and 6 also show reference x,y,z coordinate axis assignments used in the figures of this disclosure. Output channels 12 are substantially in parallel and extend in a length direction that corresponds to the x coordinate axis. Reciprocating motion of substrate 20, or motion relative to substrate 20, is in the y coordinate direction, using this coordinate assignment.

FIG. 6 shows the gas flows $F_I$, $F_O$, and $F_M$ for the various gaseous materials delivered from deposition device 10 with this embodiment. Gas flows $F_I$, $F_O$, and $F_M$ are in the x-direction, that is, along the length of elongated output channels 12.

The cross-sectional views of FIGS. 7A, 7B, 7C, and 7D are taken orthogonally to the cross-sections of FIGS. 2-4B and show gas flows in one direction from this view. Within each output channel 12, the corresponding gaseous material flows from a gas output port 24, shown in phantom in the views of FIGS. 7A, 7B, 7C, and 7D. In the embodiment of FIG. 7A, gas flow F1 directs the gaseous material along the length of output channel 12 and across substrate 20, as was described with reference to FIGS. 5 and 6. Flow F1 continues past the edge of deposition device 10 in this arrangement, flowing outward into the environment or, if desirable, to a gas collection manifold (not shown). FIG. 7B shows an alternative embodiment for gas flow F2 in which output channel 12 also provides an exhaust port 26 for redirection or drawing off of the gas flow. FIG. 7C shows an alternative embodiment for gas flow F3, in which gas output port 24 is centrally located within output channel 12 and directs gaseous material in gas flows along the channel in both directions. FIG. 7D shows an alternate embodiment for gas flow F4, in which gas output port 24 is also centrally positioned, with multiple exhaust ports 26 suitably placed near the extreme ends of output channel 12. Although unidirectional flows are preferred, some degree of mixing can occur and even may be beneficial to some extent, depending on the flow rates and other circumstances involved in a particular application.

A particular deposition device 10 may use output channels 12 configured using any one of the gas flow configurations or combinations thereof, either the F1 flow of FIG. 7A, the F2 flow of FIG. 7B, the F3 flow of FIG. 7C, the F4 flow of FIG.

7D, or some other variation in which gaseous material is directed to flow across substrate 20 along output channel 12, preferably in a substantially laminar or smooth fashion with controlled mixing. In one embodiment, one or more exhaust ports 26 are provided for each output channel 12 that delivers a reactant gaseous material. For example, referring to FIG. 6, output channels 12 for first and second reactant gaseous materials, labeled O and M, are configured with exhaust ports 26 to vent or draw off the reactant substances, following the pattern of flow F2 (FIG. 7B). This allows some recycling of materials and prevents undesirable mixing and reaction near the end of the manifold. Output channels 12 for inert gaseous material, labeled I, do not use exhaust ports 26 and thus follow the pattern of flow F1 (FIG. 7A). Although laminar flows are preferred in some embodiments, some degree of mixing can occur and even may be beneficial to some extent, depending on the flow rates and other circumstances involved in a particular application.

Exhaust port 26 is not a vacuum port, in the conventional sense, but is simply provided to draw off the gaseous flow in its corresponding output channel 12, thus facilitating a uniform gas flow pattern within the channel. A negative draw, just slightly less than the opposite of the gas pressure at gas output port 24, can help to facilitate an orderly gas flow. The negative draw can, for example, operate at a pressure of between 0.9 and 1.0 atmosphere, whereas a typical vacuum is, for example, below 0.1 atmosphere. An optional baffle 58, as shown in dotted outline in FIGS. 7B and 7D may be provided to redirect the flow pattern into exhaust port 26.

Because no gas flow around partition 22 to a vacuum exhaust is needed, output face 36 can be positioned very closely, to within about 1 mil (approximately 0.025 mm) of the substrate surface. By comparison, an earlier approach such as that described in the U.S. Pat. No. 6,821,563 to Yudovsky, cited earlier, required gas flow around the edges of channel sidewalls and was thus limited to 0.5 mm or greater distance to the substrate surface. Positioning the deposition device 10 closer to the substrate surface is preferred in the present invention. In a preferred embodiment, distance D from the surface of the substrate can be 0.4 mm or less, preferably within 0.3 mm, more preferably within 0.25 mm of the output face of the deposition device or the bottom of the guide walls that provide the flow channels.

The cross-sectional views of FIGS. 8A and 8B show why it is desirable to have the distance D relatively small, consistent with the operation of the invention. In these figures, deposition device 10 is moving over substrate 20 from left to right, as the arrow indicates. As output channel 12 carrying a reactive gaseous material M moves to the right over an area, it encounters a diffusion layer 72 from the next adjacent (previous-in-time) output channel that is primarily inert gaseous material I. In order to react on the surface of substrate 20, reactive gaseous material M must diffuse through diffusion layer 72, which has a thickness proportional to distance D. By comparison, FIG. 8B shows what happens when distance D is reduced: diffusion layer 72 is reduced proportionately. Diffusion through diffusion layer 72 happens more quickly and more efficiently, allowing less waste and reducing the overall amount of time needed for reaction on the surface of substrate 20. The lower partition walls 22 also prevent less gas to remain from the previous-in time output channel gas. It should be noted that the flow of the gases in the channels are perpendicular to the page of the FIGS. 8A and 8B, as shown by the back of the arrow, which flow maintains a concentration gradient that aids the diffusion through the thin diffusion layer 72 to the surface of the substrate 20. The surface is exposed to the gas flow of M for sufficient time for diffusion and any mixing to replace the previous-in-time output channel gas. In this particular embodiment, the flow of gas is across the surface rather than directly into the surface so that it limits the undesirable mixing of reactant gases between outlet channels, which might otherwise be exacerbated by relative oscillation of the manifold and/or substrate.

In order to provide smooth flow along the length of output channel 12, gas output port 24 may be inclined at an angle away from normal, as indicated in FIGS. 7A and 7B. Optionally, some type of gas flow redirecting structure may also be employed to redirect a downward flow from gas output port 24 so that it forms a gas flow that runs substantially in parallel to output face 36.

Figure 9:
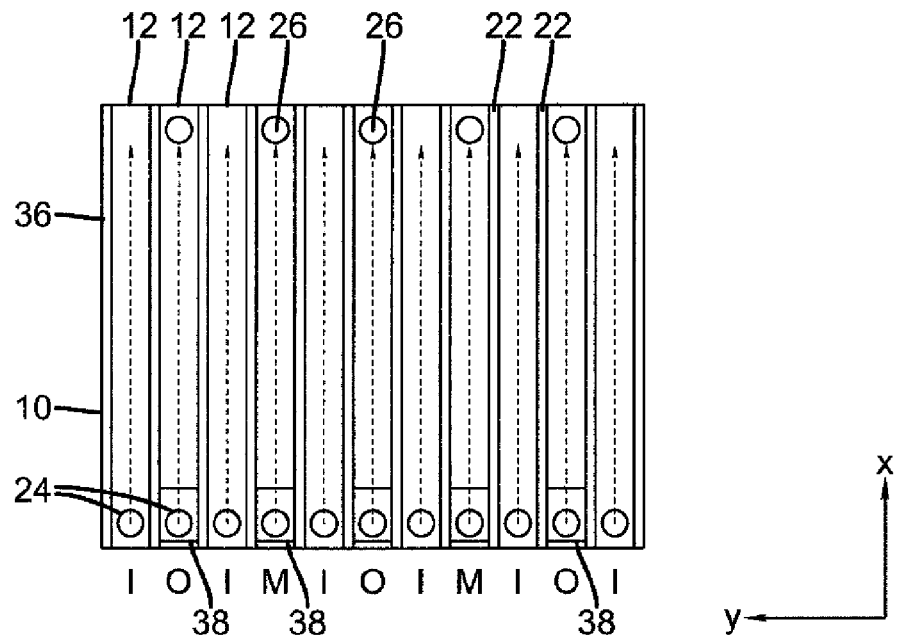
FIG. 9 is a plan view of the output face of a deposition device such as shown in FIG. 3 that can be used in the present process, showing movement of gaseous materials through an arrangement of output channels according to one embodiment of the invention.

The plan view of FIG. 9 shows output face 36 of a portion of a deposition device 10 that can be used in one embodiment. For optimizing directional gas flow in this particular embodiment, redirecting plates 38 may be positioned in each of the output channels 12 for directing reactant gaseous materials. In the embodiment shown, only output channels 12 that deliver reactant gaseous materials are provided with redirecting plates 38 and exhaust ports 26. This particular arrangement may be advantageous in some applications, where it is advantageous to surround deposition device 10 with inert gas, such as to reduce unwanted intake of ambient gases. However, redirecting plates 38 could be used on all output channels 12. Also, exhaust ports 26 could be used on some or all output channels 12. In another possible embodiment, redirecting plates can be used on all channels, but the outlet edge of the redirecting plate may be at a different x-axis position depending upon which channel is considered. In particular, it may be desirable to have the outlet edge position of the baffles 58 (as shown in FIGS. 7B and 7D) for the inert flows to be at lower x-axis positions than those of the reactant gases so that the inert purge flows can serve as mentioned above to isolate the various channels.

FIG. 9 also shows the pattern of output channels in one embodiment. Here, it has been found to be particularly advantageous to provide inert gas channels I as the outermost channels of deposition device 10. Oxidation channels with first reactant gaseous material O are next to the outermost channels, since these condition the surface for ALD reaction with the metallic component of second reactant gaseous material M.

Figure 10:
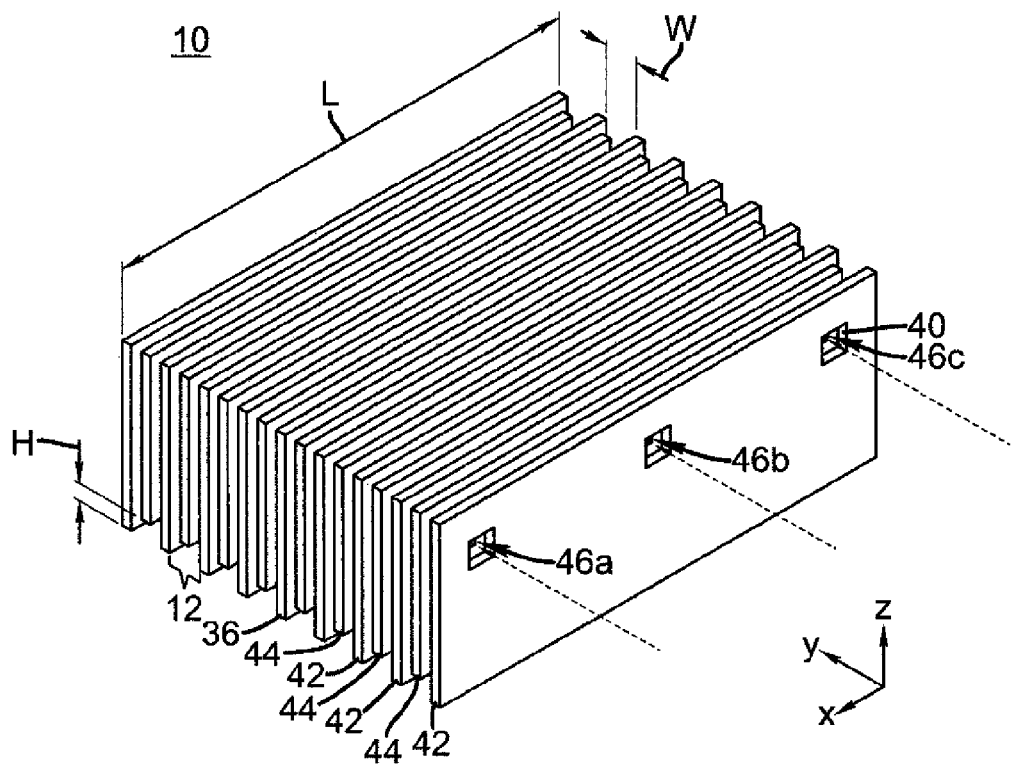
FIG. 10 is a perspective view of one embodiment of a deposition device formed from stacked plates that can be used in the present process.
Figure 11A:
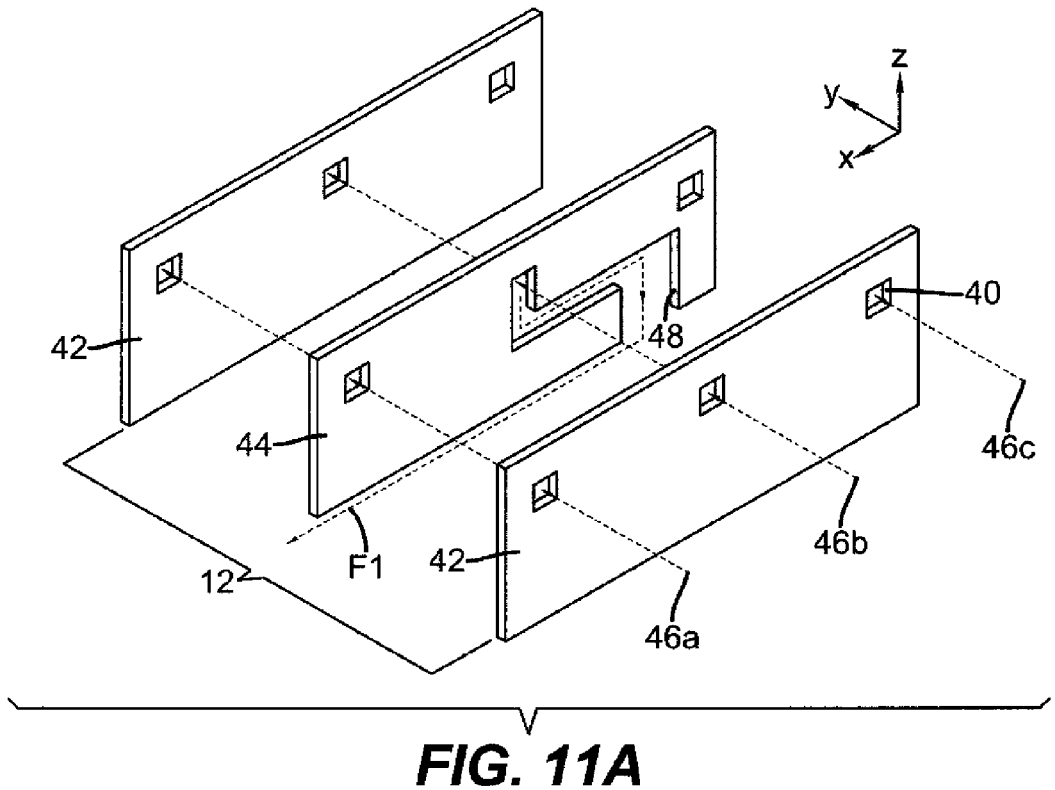
FIGS. 11A and 11B are exploded views of the construction of a deposition device that employs the stacked-plate structure shown in FIG. 10, the exploded views showing two different output channels for different gases used in the process.
Figure 11B:
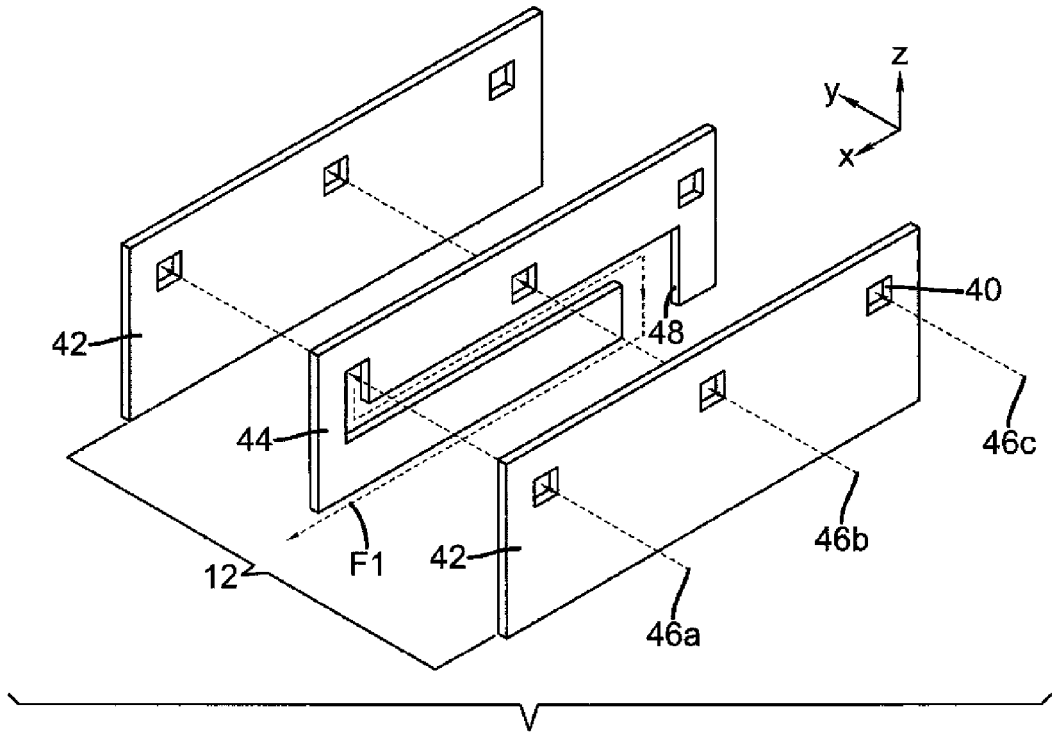

FIG. 10 shows one embodiment of a deposition device 10 that can be used in the present process in which the channels of width W, length L, and height H are formed from stacked metal plates 42 and 44 having apertures 40 forming ducts 46a,b,c. FIG. 11A shows an exploded view of a single output channel 12 section of deposition device 10 formed in this way, showing an arrangement of apertures 40 in alternating partition plates 42 and delivery plates 44. FIG. 11B shows a similar exploded view for an adjacent output channel 12. Ducts 46a, 46b, and 46c, formed by alignment of apertures 40, extend through deposition device 10 and provide input conduits for gaseous flow communication, accepting the different reactant and inert gaseous materials from external sources and providing the redirecting structures that provide gas flows along output face 36 described earlier. Baffles and other redirecting structures are not shown in these figures, but could be provided using stacked plates suitably structured, or applied after the device is assembled.

The exploded views of FIGS. 11A and 11B each show a single output channel 12 formed from stacked plates 42 and 44. In the example of FIG. 11A, output channel 12 provides gaseous material provided from duct 46b. Ducts 46a and 46c conduct other gases past this channel in the embodiment shown in FIG. 11A. Delivery plate 44, dimensioned and apertured differently than the partition plates 42 that bound output channel 12, contains a redirecting chamber 48 that redirects a portion of the gas in duct 46b into gas flow F1. In the example of FIG. 11B, output channel 12 provides gaseous material provided from duct 46a. Ducts 46b and 46c conduct other gases past this channel in the embodiment shown in FIG. 11B. Plates 42 and 44 should be of a suitable metal for conducting the reactive gaseous materials, such as stainless steel or other metal for example.

It is desirable that when a large number of plates are assembled for such an embodiment, the gas flow delivered to the substrate is uniform across all of the channels delivering a particle flow (I, M, or O). This can be accomplished by proper design of the plates, such as having restrictions in some part of the flow pattern for each plate which are accurately machined to provide a reproducible pressure drop for each channel.

Although the method of stacking plates is a particularly useful way of constructing a deposition device for use in this invention, there are a number of other methods to build such structures and may be useful in alternate embodiments of deposition devices that can be used in the present process. For example, the deposition device for use in the present process may be constructed by direct machining of a metal block, or of several metal blocks adhered together. Furthermore, molding techniques involving internal mold features can be employed, as will be understood by the skilled artisan. A deposition device can also be constructed using any of a number stereolithography techniques.

As can be seen from the example embodiment of FIGS. 10, 11A, and 11B, deposition device 10 can be constructed of very small size, with each output channel 12 having the width of a sheet of metal plating. For example, in one embodiment using the arrangement of FIGS. 10, 11A, and 11B, output channel 12 is about 0.034 inches (0.86 mm) in width W. Output channels 12 for different materials could be fabricated at different thicknesses to obtain width W ranges, preferably from about 0.01 inches (0.25 mm) to about 0.1 inches (2.5 mm) for a compact arrangement. The length L of output channel 12 can vary, depending on the needed uniformity and desired gas pressure. In one embodiment, output channel length L is about 3 inches (75 mm). The height H of output channels 12 formed from extending portions of stacked plates 42 is about 0.1 inches in one embodiment.

Figure 12:
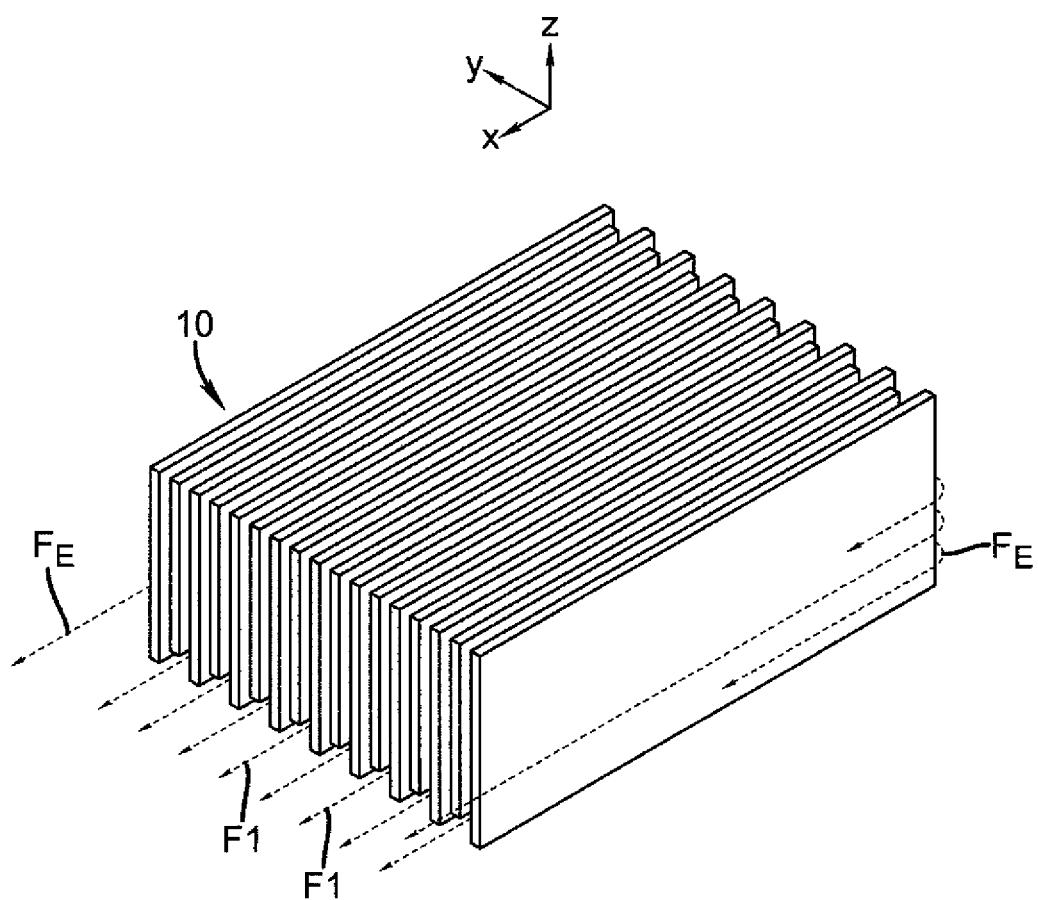
FIG. 12 is a perspective view showing an embodiment using an enveloping shroud of inert gas directed along the perimeter of the deposition device.

Because gas flow can inadvertently draw ambient gases, due to low-pressure zones that are created, it may be useful to provide additional protection barrier from an inert layer. Referring to FIG. 12, there is shown an envelopment gas flow $F_E$ by which an additional flow of inert gas is used on one or more sides of deposition device 10 to prevent ambient gases from contaminating the process gases.

As was particularly described with reference to FIGS. 4A and 4B, deposition device 10 requires movement relative to the surface of substrate 20 in order to perform its deposition function. This relative movement can be obtained in a number of ways, including movement of either or both deposition device 10 and substrate 20, such as by movement of a process that provides a substrate support. Movement can be oscillating or reciprocating or could be continuous movement, depending on how many deposition cycles are needed. Rotation of a substrate can also be used, particularly in a batch process, although continuous processes are preferred.

Typically, ALD requires multiple deposition cycles, building up a controlled film depth with each cycle. Using the nomenclature for types of gaseous materials given earlier, a single cycle can, for example in a simple design, provide one application of first reactant gaseous material O and one application of second reactant gaseous material M.

The distance between output channels for O and M reactant gaseous materials determines the needed distance for reciprocating movement to complete each cycle. For the example deposition device 10 of FIG. 9, having a nominal channel width of 0.034 inches in width W for each output channel 12, reciprocating motion (along the y axis as used herein) of at least 0.20 inches would be required. For this example, an area of substrate 20 would be exposed to both first reactant gaseous material O and second reactant gaseous material M with movement over this distance. In some cases, consideration for uniformity may require a measure of randomness to the amount of reciprocating motion in each cycle, such as to reduce edge effects or build-up along the extremes of reciprocation travel.

A deposition device 10 may have only enough output channels 12 to provide a single cycle. Alternately, deposition device 10 may have an arrangement of multiple cycles, enabling it to cover a larger deposition area or enabling its reciprocating motion over a distance that allows two or more deposition cycles in one traversal of the reciprocating motion distance.

In one embodiment, a given area of the substrate is exposed to a gas flow in a channel for less than 500 milliseconds, preferably less than 100 milliseconds. The relative movement of the substrate to a channel during oscillation is at a speed of at least 0.1 cm/sec, and the gas flow in the channels is at least 1 cm/sec. Preferably, the temperature of the substrate during deposition is under 300° C., more preferably under 250° C.

For example, in one particular application, it was found that each O-M cycle formed a layer of one atomic diameter over about ¼ of the treated surface. Thus, four cycles, in this case, are needed to form a uniform layer of 1 atomic diameter over the treated surface. Similarly, to form a uniform layer of 10 atomic diameters in this case, then, 40 cycles would be required.

Figure 13:
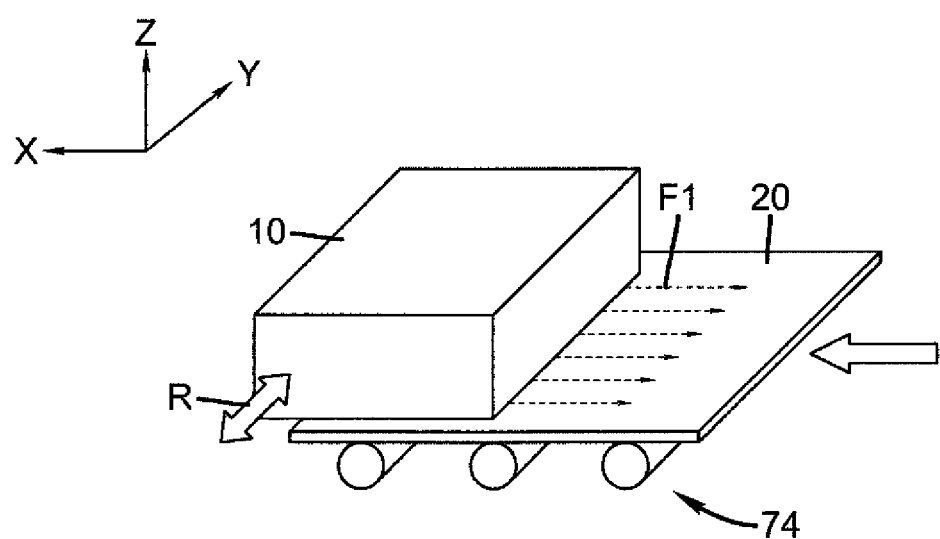
FIG. 13 is a schematic diagram showing an alternative motion pattern for reciprocating and orthogonal movement.

An advantage of the reciprocating motion used for a deposition device 10 used in one embodiment of the present process is that it allows deposition onto a substrate 20 whose area exceeds the area of output face 36. FIG. 13 shows schematically how this broader area coverage can be effected, using reciprocating motion along the y axis as shown by arrow R and also movement orthogonal or transverse to the reciprocating motion, relative to the x axis. Again, it must be emphasized that motion in either the x or y direction, as shown in FIG. 13, can be effected either by movement of deposition device 10, or by movement of substrate 20 provided with a substrate support 74 that provides movement, or by movement of both deposition device 10 and substrate 20.

In FIG. 13 the relative motion of the depositor and the substrate are perpendicular to each other. It is also possible to have this relative motion in parallel. In this case, the relative motion needs to have a nonzero frequency component that represents the oscillation and a zero frequency component that represents the displacement of the substrate. This combination can be achieved by: an oscillation combined with displacement of the deposition device over a fixed substrate; an oscillation combined with displacement of the substrate relative to a fixed substrate deposition device; or any combinations wherein the oscillation and fixed motion are provided by movements of both substrates.

In a preferred embodiment, ALD can be performed at or near atmospheric pressure and over a broad range of ambient and substrate temperatures, preferably at a temperature of under 300° C. Preferably, a relatively clean environment is needed to minimize the likelihood of contamination; however, full "clean room" conditions or an inert gas-filled enclosure would not be required for obtaining good performance when using preferred embodiments of the process of the present invention.

Figure 14:
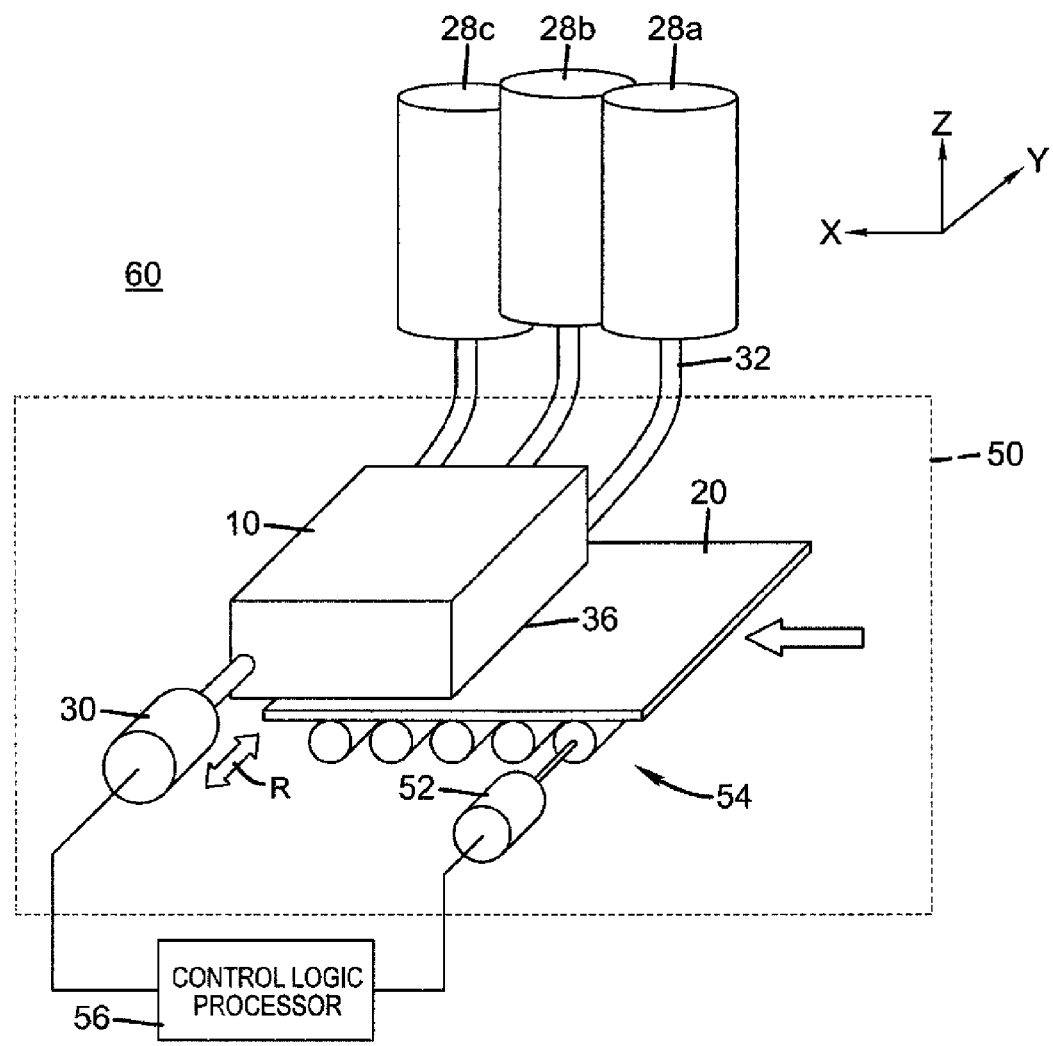
FIG. 14 is a block diagram of one embodiment of a deposition system that uses the process according to the present invention.

FIG. 14 shows one embodiment of an Atomic Layer Deposition (ALD) 60 process for making a metal-oxide-based encapsulation layer, having a chamber 50 for providing a relatively well-controlled and contaminant-free environment. Gas supplies 28a, 28b, and 28c provide the first, second, and third gaseous materials to deposition device 10 through supply lines 32. The optional use of flexible supply lines 32 facilitates ease of movement of deposition device 10. For simplicity, an optional vacuum vapor recovery process and other support components are not shown in FIG. 14 but could also be used. A transport subsystem 54 provides a substrate support that conveys substrate 20 along output face 36 of deposition device 10, providing movement in the x direction, using the coordinate axis system employed in the present disclosure. Motion control, as well as overall control of valves and other supporting components, can be provided by a control logic processor 56, such as a computer or dedicated microprocessor assembly, for example. In the arrangement of FIG. 14, control logic processor 56 controls an actuator 30 for providing reciprocating motion to deposition device 10 and also controls a transport motor 52 of transport subsystem 54.

Figure 15:
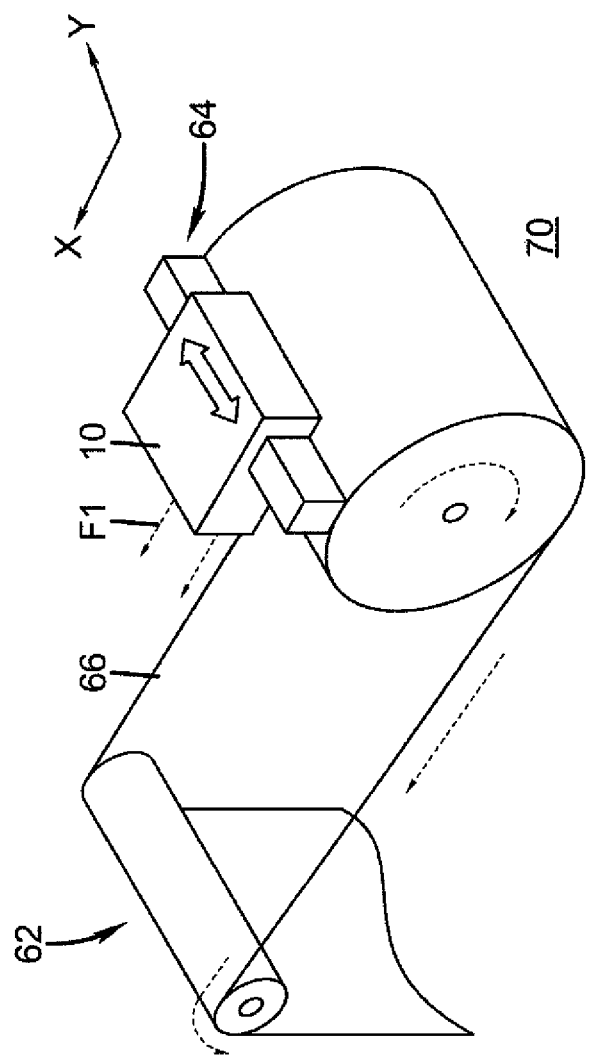
FIG. 15 is a block diagram showing one embodiment of a deposition system applied to a moving web in accordance with the present process.

FIG. 15 shows an alternate embodiment of an Atomic Layer Deposition (ALD) process 70 for thin film deposition of metal-oxide-based encapsulation layer onto a web substrate 66 that is conveyed past deposition device 10 along a web conveyor 62 that acts as a substrate support. A deposition device transport 64 conveys deposition device 10 across the surface of web substrate 66 in a direction transverse to the web travel direction. In one embodiment, deposition device transport 64 uses a lead screw that traverses the width of web substrate 66. In another embodiment, multiple deposition devices 10 are used, at suitable positions along web 62.

Figure 16:
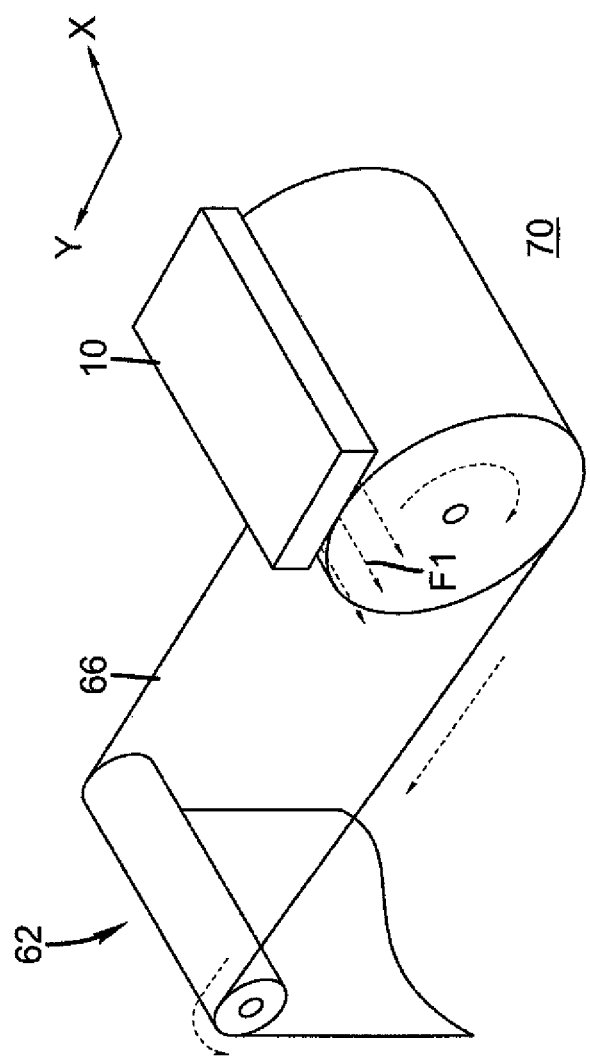
FIG. 16 is a block diagram showing another embodiment of deposition system applied to a moving web in accordance with the present process, with the deposition device stationary.
Figure 17:
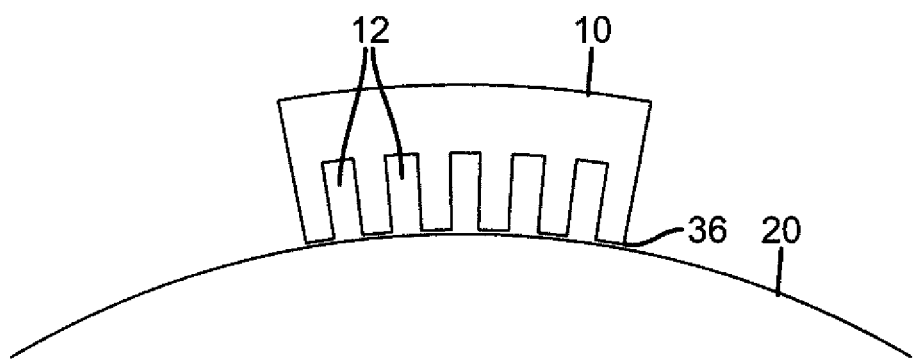
FIG. 17 is a cross-sectional side view of one embodiment of a deposition device with an output face having curvature that can be used in the present process.
Figure 18:
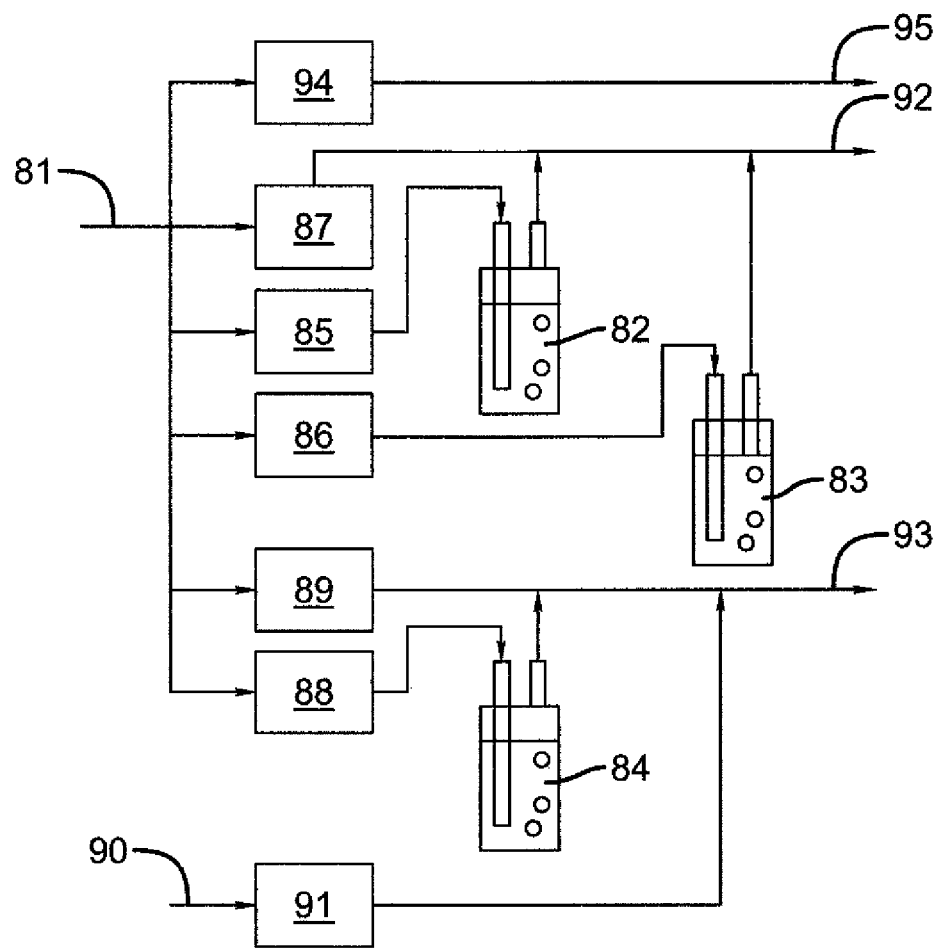
FIG. 18 is a block diagram of the source materials for a thin film deposition process according to the Examples.
Figure 19:
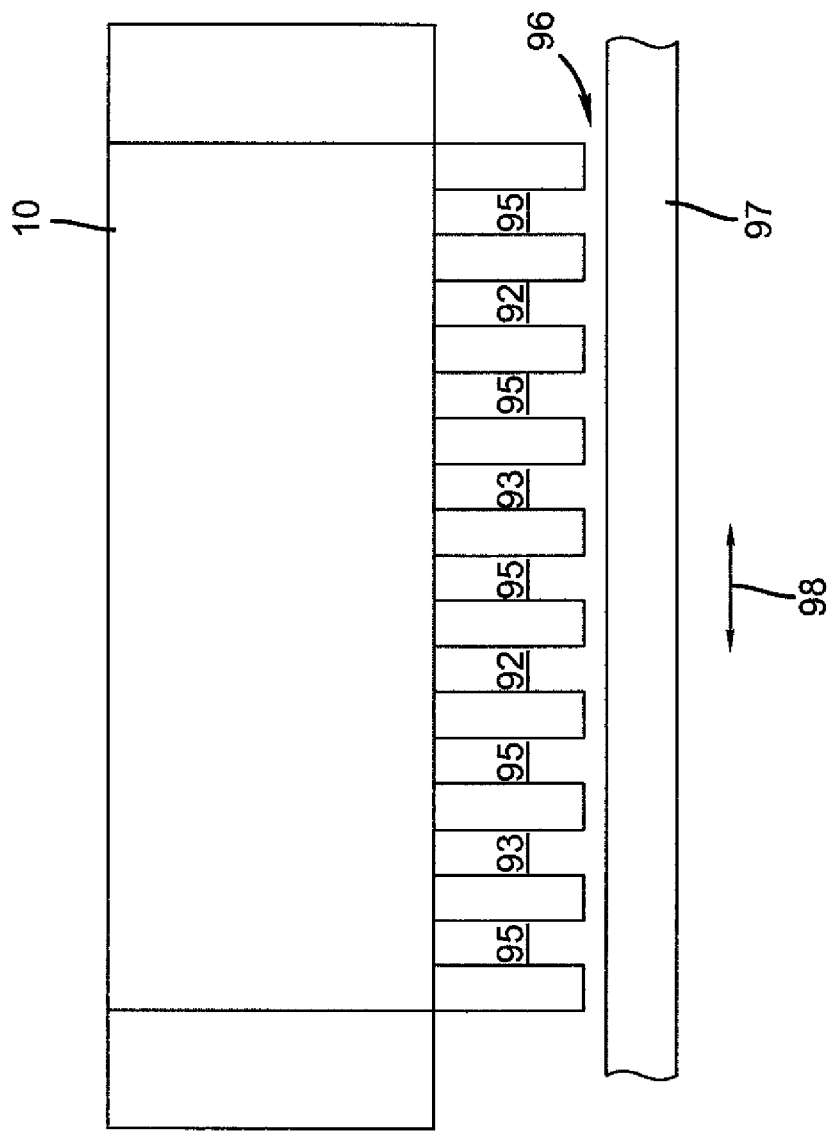
FIG. 19 is a cross-sectional side view of the a deposition device used in the present process, showing the arrangement of gaseous materials provided to a substrate that is subjected to thin film deposition process of the Examples.

FIG. 16 shows another Atomic Layer Deposition (ALD) system 70 for depositing a metal-oxide-based encapsulating layer in a web arrangement, using a stationary deposition device 10 in which the flow patterns are oriented orthogonally to the configuration of FIG. 14. In this arrangement, motion of web conveyor 62 itself provides the movement needed for ALD deposition. Reciprocating motion could also be used in this environment, such as by repeatedly reversing the direction of rotation of a web roller to move substrate 66 forward and backwards relative to deposition device 10. Reciprocation motion can also be obtained by allowing a reciprocating motion of the deposition device across an arc whose axis coincides with the roller axis, while the web is moved in a constant motion. Referring to FIG. 17, an embodiment of a portion of deposition device 10 is shown in which output face 36 has an amount of curvature, which might be advantageous for some web coating applications. Convex or concave curvature could be provided. It will be understood that in other embodiments, nitrides or other materials can be used rather than oxides, as long as they produce an inorganic material that is a dielectric having the desired barrier properties for moisture and air.

Optionally, the present process can be accomplished with other apparatus or systems described in more detail in commonly assigned U.S. application Ser. No. 11/392,007 now U.S. Pat. No. 7,413,982, U.S. application Ser. No. 11/392,006 now U.S. Pat. No. 7,456,429, U.S. application Ser. No. 11/620,744, and U.S. application Ser. No. 11/620,740 now U.S. Pat. No. 7,789,961. All the above-identified applications incorporated by reference in their entirety.

In the embodiments in the latter three applications, a delivery device having an output face for providing gaseous materials for thin-film material deposition onto a substrate comprises elongated emissive channels in at least one group of elongated emissive channels, of the three groups of elongated emissive channels (namely, at least one group of: (i) one or more first elongated emissive channels, (ii) one or more second elongated channels, and (iii) a plurality of third elongated channels) that is capable of directing a flow, respectively, of at least one of the first gaseous material, second gaseous material, and the third gaseous material substantially orthogonally with respect to the output face of the delivery device, which flow of gaseous material is capable of being provided, either directly or indirectly from each of the elongated emissive channels in the at least one group, substantially orthogonally to the surface of the substrate.

Each elongated channel is associated with an elongated output opening, substantially parallel to other elongated output openings, in the face of the delivery device, which opening can be connected to the elongated channel or can directly be the outlet opening of the channel.

In one embodiment, apertured plates are disposed substantially in parallel to the output face, and apertures on at least one of the apertured plates form the first, second, and third elongated emissive channels. In an alternative embodiment, the apertured plates are substantially perpendicularly disposed with respect to the output face.

In one such embodiment, the deposition device comprises exhaust channels, for example, a delivery device for thin-film material deposition onto a substrate comprising: (a) a plurality of inlet ports comprising at least a first inlet port, a second inlet port, and a third inlet port capable of receiving a common supply for a first reactive gaseous material, a second reactive gaseous material, and a third (inert purge) gaseous material, respectively; (b) at least one exhaust port capable of receiving exhaust gas from thin-film material deposition and at least two elongated exhaust channels, each of the elongated exhaust channels capable of gaseous fluid communication with the at least one exhaust port; and (c) at least three pluralities of elongated output channels, (i) a first plurality of first elongated output channels, (ii) a second plurality of second elongated output channels, and (iii) a third plurality of third elongated output channels, each of the first, second, and third elongated output channels capable of gaseous fluid communication, respectively, with one of the corresponding first inlet port, second inlet port, and third inlet port; wherein each of the first, second, and third elongated output channels and each of the elongated exhaust channels extend in a length direction substantially in parallel; wherein each first elongated output channel is separated on at least one elongated side thereof from a nearest second elongated output channel by a relatively nearer elongated exhaust channel and a relatively less near third elongated output channel; and wherein each first elongated output or emissive channel and each second elongated output or emissive channel is situated between relatively nearer elongated exhaust channels and between relatively less nearer elongated output or emissive channels.

Further embodiments can comprise a gas diffuser associated with at least one group of the three groups of elongated emissive channels such that at least one of the first, second, and third gaseous material, respectively, is capable of passing through the gas diffuser prior to delivery from the delivery device to the substrate, during thin-film material deposition onto the substrate, and wherein the gas diffuser maintains flow isolation of the at least one of first, second, and third gaseous material downstream from each of the elongated emissive channels in the at least one group of elongated emissive channels.

In one embodiment such a gas diffuser is capable of providing a friction factor for gaseous material passing there through that is greater than $1\times10^2$, thereby providing back pressure and promoting equalization of pressure where the flow of the at least one first, second and third gaseous material exits the delivery device. In one embodiment of the invention, the gas diffuser comprises a porous material through which the at least one of the first, second, and third gaseous material passes. In a second embodiment of the invention, the gas diffuser comprises a mechanically formed assembly comprising at least two elements, comprising interconnected passages, for example, in which nozzles are connected to a flow path provided by a thin space between parallel surface areas in the two elements.

In one embodiment, the one or more of the gas flows from the deposition devices provides a pressure that at least contributes to the separation of the surface of the substrate from the face of the delivery head, thereby providing a "floating head" or "air bearing" type deposition head, which can help to stabilize the gas flows and limit intermixing of the gas flows.

The process of the present invention is advantaged in its capability to perform deposition onto a substrate over a broad range of temperatures, including room or near-room temperature in some embodiments. The process of the present invention can operate in a vacuum environment, but is particularly well suited for operation at or near atmospheric pressure.

Devices that may be encapsulated by this method are not constrained by their substrate, or support; devices may include supports that are organic or inorganic materials. For example, the support may comprise inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP). Flexible substrates can also be thin metal foils such as stainless steel provided they are coated with an insulating layer for electrical isolation as necessary for the OLED device. A flexible support, in some embodiments of the present invention, allows for roll processing, which may be continuous, providing economy of scale and economy of manufacturing over flat and/or rigid supports. The flexible support chosen preferably is capable of wrapping around the circumference of a cylinder of less than about 50 cm diameter, more preferably 25 cm diameter, most preferably 10 cm diameter, without distorting or breaking, using low force as by unaided hands. The preferred flexible support may be rolled upon itself. However, if flexibility is not a concern, then the substrate may be a wafer or sheet made of materials including glass and silicon. The thickness of the substrate may vary, and according to particular examples it can range from about 100 μm to about 1 cm.

Figure 20:
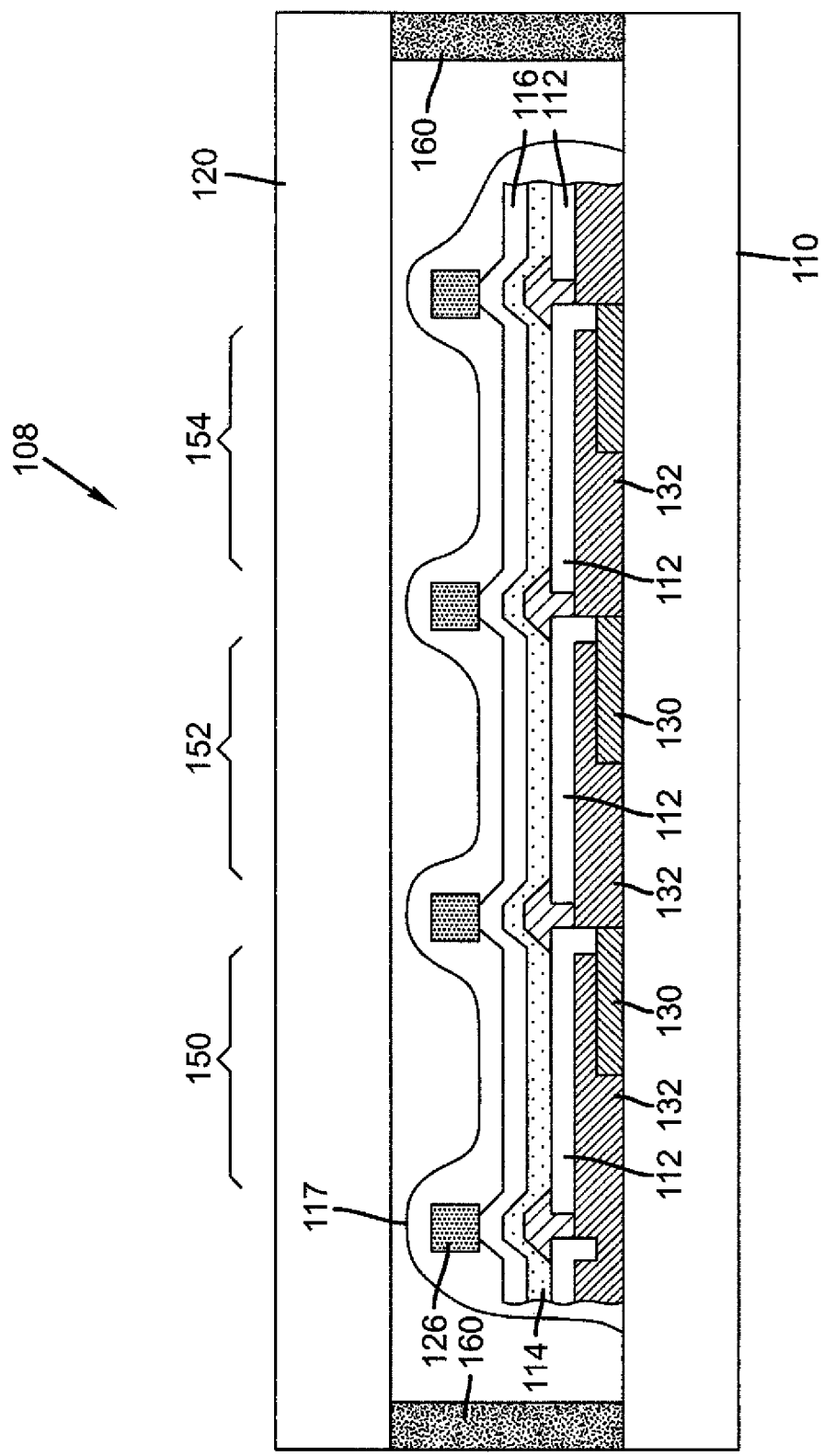
FIG. 20 is a cross-sectional view of a top-emitting OLED device according to an embodiment of the present invention.

Referring to FIG. 20, an OLED device 108 according to one embodiment of the present invention comprises a substrate 110, a first electrode 112, a conductive electrode 116, an encapsulating package 117 having a thickness between 10 nm and 10,000 nm, preferably less than 500 nm, more preferably 100 to 250 nm, one or more organic layers 114 formed between the first electrode 112 and the conductive electrode 116, at least one organic layer 114 being a light-emitting layer; and a patterned auxiliary electrode 126 in electrical contact with the conductive electrode 116.

In a top-emitter embodiment of an OLED device, the thin film encapsulating package 117 is formed over a transparent top conductive electrode 116 and the first electrode 112 is a bottom electrode. The bottom electrode may be reflective. It is preferred that the conductive electrode 116 has a refractive optical index equal to or greater than the refractive optical index of the one or more organic layers 114. By providing such relative refractive indices, light emitted from the organic layers 114 will not be trapped by total internal reflection in the organic layers 114 since light may travel from the organic layers 114 into the equal- or higher-index conductive electrode 116.

Thin-film electronic components 130 having planarization layers 132 may be employed to control the OLED device, as is known in the art. A cover 120 is provided over the OLED and electrode layers and adhered to the substrate 110 to protect the OLED device, for example using an adhesive 160.

The bottom first electrode 112 can be patterned to form light-emitting areas 150, 152, and 154 while a patterned auxiliary electrode 126 may be formed between the light-emitting areas (as shown) or under the light-emitting areas (not shown). The conductive electrode 116 may be unpatterned and formed continuously over the organic layers 114.

In some embodiments of the present invention (FIG. 2), the light-emitting organic layer 114 may emit white light, in which case color filters 140R, 140G, 140B may be formed, for example on the cover 120, to filter light to provide a full-color light-emissive device with colored light-emitting areas 150, 152, and 154.

Figure 21:
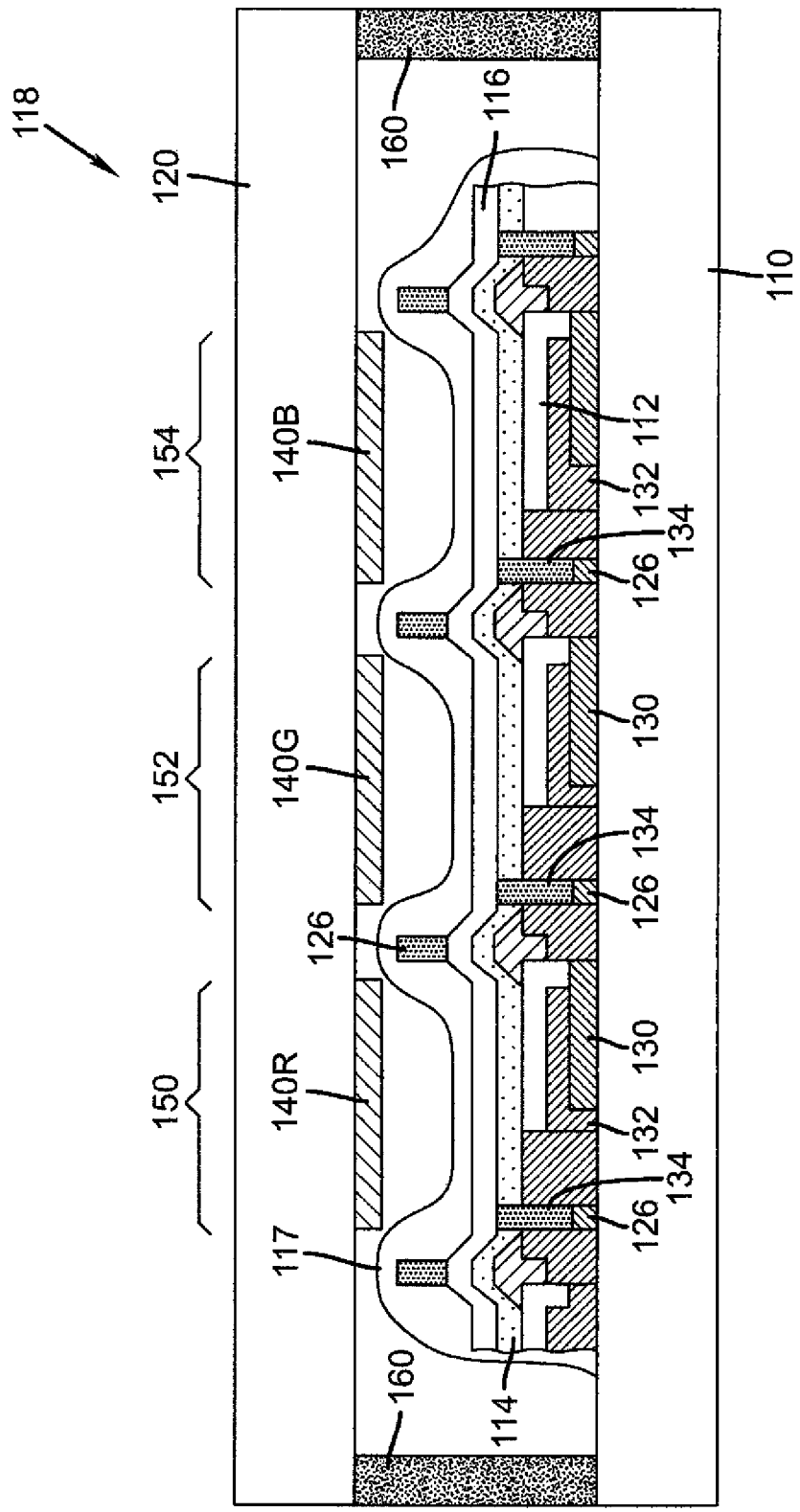
FIG. 21 is a cross-sectional view of an OLED device having color filters according to an alternative embodiment of the present invention.

In various embodiments of the present invention, the auxiliary electrode 126 may be formed on the side of the conductive electrode 116 opposite the one or more organic layers 114, as shown in FIG. 21. Such layers may be deposited by sputtering or evaporating metals through masks, for example as described in U.S. Pat. No. 6,812,637 entitled "OLED DISPLAY WITH AUXILIARY ELECTRODE" by Cok et al. As shown in FIG. 21, the auxiliary electrode 126 may be formed on the side of the one or more organic layers 114 opposite the conductive electrode 116 and may be electrically connected to the conductive electrode 116 through vias 134 formed in the one or more organic layers 114. The auxiliary electrode 126 may be formed using conventional photolithographic techniques while the vias 134 may be formed using laser ablation, for example, as described in U.S. Pat. No. 6,995,035 entitled "METHOD OF MAKING A TOP-EMITTING OLED DEVICE HAVING IMPROVED POWER DISTRIBUTION" by Cok et al. Materials employed in forming the auxiliary electrode may include, e.g., aluminum, silver, magnesium, and alloys thereof.

As employed herein, an encapsulating package 117 comprises one or more layers, preferably 2 to 15, depending on the thickness of each layer. Such layers are applied to the OLED device by atomic layer deposition as described above and in the Examples, thereby providing an encapsulating package 117 resistive to penetration by moisture and oxygen. Generally, it is preferred to form the encapsulating package 117 at a temperature less than 140 degrees C. to avoid damaging organic layers. Alternatively, the encapsulating package 117 may be formed at a temperature less than 120 degrees C. or less than 110 degrees C.

Each encapsulating layer is formed by alternately providing a first reactive gaseous material and a second reactive gaseous material, wherein the first reactive gaseous material is capable of reacting with the coated substrate treated with the second reactive gaseous material. The first reactive gaseous material completely covers the exposed surface of the OLED device, while the second reactive gaseous material reacts with the first reactive gaseous material to form a layer highly resistant to environmental contaminants. Applicants have demonstrated the problems of the conventional deposition art for encapsulating layers in protective organic materials and the improvements found by employing an encapsulating package according to the present invention.

A wide variety of metal oxides, nitrides, and other compounds may be employed to form the thin film encapsulation package. The thin film encapsulation package, for example, can comprise zinc oxide in combination with at least one other compound, in separate layers or the same layer. The other compound can be a complex mixture created by applying dopants, for example by employing indium with tin oxide to form indium tin oxide. Suitably, an encapsulating material can be made using an inorganic compound that is a dielectric oxide selected from the group consisting of $Al_2O_3$, $SiO_2$, $TiO_2$, $ZrO_2$, MgO, $HfO_2$, $Ta_2O_5$, aluminum titanium oxide, tantalum hafnium oxide, and indium tin oxide.

A variety of thicknesses may be employed for the thin film encapsulation package, depending on the subsequent processing of the device and environmental exposure. The thickness of the thin film encapsulation package may be selected by controlling the number of sequentially deposited layers of reactive gases.

A planarizing underlayer of parylene polymer can be used to improve the performance of a thin film encapsulation package, as will be appreciated by the skilled artisan. Parylene layers for OLED encapsulation are disclosed in US 2006/0246811 by Winters et al., hereby incorporated by reference. For example, a 120 nm parylene or other suitable polymeric layer can be employed to achieve the planarizing effect and presumably to serve as a buffer layer for mitigating or augmenting stress force created by the inorganic encapsulant layers.

Referring again to the OLED device of FIG. 20, substrate 110 may be opaque to the light emitted by OLED device 108. Common materials for substrate 110 are glass or plastic. First electrode 112 may be reflective. Common materials for first electrode 112 are aluminum and silver or alloys of aluminum and silver. Organic Electroluminescent (EL) element 114 includes at least a light emitting layer (LEL) but frequently also includes other functional layers such as an electron transport layer (ETL), a hole transport layer (HTL), an electron blocking layer (EBL), or a hole blocking layer (HBL), and other suitable functional layers known in the art. The discussion that follows is independent of the number of functioning layers and independent of the materials selection for the organic EL element 114. Often a hole injection layer is added between organic EL element 114 and the anode and often an electron injection layer is added between organic EL element 114 and the cathode. In operation, a positive electrical potential is applied to the anode and a negative potential is applied to the cathode. Electrons are injected from the cathode into organic EL element 114 and driven by the applied electrical field to move toward the anode; holes are injected from the anode into organic EL element 114 and driven by the applied electrical field to move toward the cathode. When electrons and holes combine in organic EL element 114, light is generated and emitted by OLED device 108.

Material for the conductive electrode 116 can include inorganic oxides such as indium oxide, gallium oxide, zinc oxide, tin oxide, molybdenum oxide, vanadium oxide, antimony oxide, bismuth oxide, rhenium oxide, tantalum oxide, tungsten oxide, niobium oxide, or nickel oxide. These oxides are electrically conductive because of non-stoichiometry. The resistivity of these materials depends on the degree of non-stoichiometry and mobility. These properties as well as optical transparency can be controlled by changing deposition conditions. The range of achievable resistivity and optical transparency can be further extended by impurity doping. An even larger range of properties can be obtained by mixing two or more of these oxides. For example, mixtures of indium oxide and tin oxide, indium oxide and zinc oxide, zinc oxide and tin oxide, or cadmium oxide and tin oxide have been the most commonly used transparent conductors.

A top-emitting OLED device may be formed by providing a substrate 110 with a bottom first electrode 112 and one or more organic layers 114 formed thereon, at least one organic layer being a light-emitting layer, forming a conductive protective top electrode 16 comprising a transparent conductive oxide over the one or more organic layers opposite the bottom electrode 112 wherein the conductive electrode 116 is a layer having a thickness less than 100 nm, and forming a patterned auxiliary electrode 126 in electrical contact with the conductive electrode 116.

Alternatively, a bottom-emitting OLED device may be formed by providing a conductive protective bottom electrode comprising a transparent conductive oxide layer, as will be appreciated by the skilled artisan.

OLED devices of this invention can also employ various well-known optical effects in order to enhance their properties if desired. This includes optimizing the encapsulation package to yield maximum light transmission. Providing anti-glare or anti-reflection coatings over the display, providing a polarizing medium over the display, or providing colored, neutral density, or color conversion filters over the display. Separate layers of filters, polarizers, and anti-glare or anti-reflection coatings may be specifically provided over the encapsulation package or included as a pre-designed characteristic of the encapsulation package, especially in the case of a multilayer encapsulation package. Such optical films are further described in U.S. patent application Ser. No. 11/861,442 to Fedorovskaya et al., filed Sep. 26, 2007, hereby incorporated by reference in its entirety.

The present invention may also be practiced with either active- or passive-matrix OLED devices. It may also be employed in display devices or in area illumination devices. In a preferred embodiment, the present invention is employed in a flat-panel OLED device composed of small-molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

EXAMPLES

Description of the Coating Apparatus

All of the following thin film examples employ a coating apparatus, for atomic layer deposition, having the flow setup indicated in FIG. 3, which is a block diagram of the source materials for a thin film deposition process according to the Examples.

The flow setup is supplied with nitrogen gas flow 81 that has been purified to remove oxygen and water contamination to below 1 ppm. The gas is diverted by a manifold to several flow meters which control flows of purge gases and of gases diverted through bubblers to select the reactive precursors. In addition to the nitrogen supply, air flow 90 is also delivered to the apparatus. The air is pretreated to remove moisture.

The following flows are delivered to the ALD coating apparatus: metal (zinc) precursor flow 92 containing metal precursors diluted in nitrogen gas; oxidizer-containing flow 93 containing non-metal precursors or oxidizers diluted in nitrogen gas; and nitrogen purge flow 95 composed only of the inert gas. The composition and flows of these streams are controlled as described below.

Gas bubbler 82 contains diethylzinc. Gas bubbler 83 contains trimethylaluminum. Both bubblers are kept at room temperature. Flow meters 85 and 86 deliver flows of pure nitrogen to the diethylzinc bubbler 82 and trimethylaluminum bubbler 83, respectively. The flows of trimethylaluminum and diethylzinc can be alternately or sequentially supplied to the OLED device in order to provide alternating encapsulating layers on the OLED device or they can be supplied simultaneously for a mixed layer.

The output of the bubblers contain nitrogen gas saturated with the respective precursor solutions. These output flows are mixed with a nitrogen gas dilution flow delivered from flow meter 87 to yield the overall flow of metal precursor flow 92. In the following examples, the flows will be as follows:

Flow meter 85: To Diethylzinc Bubbler Flow
Flow meter 86: To Trimethylaluminum Bubbler Flow
Flow meter 87: To Metal Precursor Dilution Flow Gas bubbler 84 contains pure water for the control (or ammonia in water for the inventive example) at room temperature. Flow meter 88 delivers a flow of pure nitrogen gas to gas bubbler 84, the output of which represents a stream of saturated water vapor. An airflow is controlled by flow meter 91. The water bubbler output and air streams are mixed with dilution stream from flow meter 89 to produce the overall flow of oxidizer-containing flow 93 which has a variable water composition, ammonia composition, oxygen composition, and total flow. In the following examples, the flows will be as follows:

Flow meter 88: To Water Bubbler
Flow meter 89: To Oxidizer Dilution Flow
Flow meter 91: To Air Flow Flow meter 94 controls the flow of pure nitrogen that is to be delivered to the coating apparatus.

Streams or Flows 92, 93, and 95 are then delivered to an atmospheric, pressure deposition device 10 where they are directed out of the channels or microchamber slots as indicated in FIG. 4. A gap 96 of approximately 0.15 mm exists between the elongated channels (not shown) and the substrate 97. The microchambers are approximately 2.5 mm tall, 0.86 mm wide, and run the length of the deposition device 10 which is 76 mm. The reactant materials in this configuration are delivered to the middle of the slot and flow out of the front and back.

In order to perform a deposition, the deposition device 10 is positioned over a portion of the substrate 97 and then moved in a reciprocating fashion over the substrate, as represented by the arrow 98. The length of the reciprocation cycle was 32 mm. The rate of motion of the reciprocation cycle is 30 mm/sec.

The following characterization is used:
Description of OLED Test Conditions, Measurement and Analysis The test conditions used to evaluate the OLED devices included:

(1) lighting them up by applying voltage to the cathode and anode, (2) photographing lit up devices with a Sony XC-75 black and white CCD camera with 3.72 μm/pixel resolution and 40× magnification. For accurate dark spot evaluation the voltage was applied to the device to produce the best visual contrast for recognizing existence and measurements of the dark spots on the test icon, (3) storing OLED devices either at room temperature of 24° C. and 50% relative humidity (RH) for a certain period of time (some devices), or (4) storing the devices in a humidity chamber (HC) at 85° C./85% (85/85) RH (relative humidity) in an accelerated humidity/oxygen resistance test.

Materials Used:

(1) $Me_3Al$ (commercially available from Aldrich Chemical Co.)

(2) $Et_2Zn$ (commercially available from Aldrich Chemical Co.)

Description of the Encapsulation Process Using the Coating Apparatus

An OLED device was constructed as detailed below for various inventive and comparative OLED devices. After forming the cathode layer, the OLED device was taken from the clean room and exposed to the atmosphere prior to depositing the thin film encapsulating layer. The 2.5×2.5 inch square (62.5 mm square) OLED device was positioned on a platen, held in place by a vacuum assist, and heated to 110° C. The platen with the glass substrate was positioned under the deposition device 10 of the deposition apparatus that directs the flow of the active precursor gasses. The spacing between the device and the coating head was adjusted using a micrometer to 30 microns.

The deposition device 10 has isolated channels through which flow: (1) inert nitrogen gas; (2) a mixture of nitrogen, air and water vapor; and (3) a mixture of active metal alkyl vapor ($Me_3Al$ or $Et_2Zn$) in nitrogen. The flow rate of the active metal alkyl vapor was controlled by bubbling nitrogen through the pure liquid ($Me_3Al$ or $Et_2Zn$) contained in an airtight bubbler by means of individual mass flow control meters. The flow of water vapor was controlled by adjusting the bubbling rate of nitrogen passed through pure water in a bubbler. The temperature of the coating head was maintained at 40° C. The coating process was initiated by oscillating the coating head across the substrate for the number of cycles specified.

In the following experiments, a flow rate of 26 sccm or 13 sccm was used to supply the diethylzinc. A flow rate of 4 sccm was used to supply the trimethylaluminum bubbler flow. A flow rate of 180 sccm or 150 sccm was used to supply the metal precursor dilution flow. A flow rate of 15 sccm was used to supply the water bubbler. A flow rate of 180 sccm or 150 sccm was used to supply the oxidizer dilution flow. A flow rate of 37.5 sccm or 31.3 sccm was used to supply the air flow.

The deposition process was calibrated to determine the number of cycles to produce the desired thickness of zinc oxide or aluminum oxide layers. This number of cycles was then used to coat an OLED device with the encapsulation layer or layers, as desired. Immediately after encapsulation, the device was lit by applying voltage to the electrodes.

Comparative Examples 1-2

A Comparative Device 1 and Comparative Device 2 were constructed in the following manner.

1. A glass substrate coated with about a 21.5 nm layer of indium-tin oxide (ITO), as the anode, was sequentially ultrasonicated in a commercial detergent, rinsed in deionized water, degreased in toluene vapor and exposed to an oxygen plasma for about 1 min.

2. Over the ITO was deposited a thin layer of a hole-injecting material (HIL). For Comparative Device 1, fluorocarbon ($CF_x$) was applied by plasma-assisted deposition of $CHF_3$, as described in U.S. Pat. No. 6,208,075 by Hung et al. Comparative Device 2 used a different HIL material.

3. Subsequently a layer (HTL) of hole-transporting material 4,4'-Bis[N-(1-naphthyl)-N-phenylamino]biphenyl (NPB) was deposited to a thickness of 75 nm.

4. Next, an electron-transporting layer (ETL) and light-emitting layer (LEL) corresponding to 75 nm of tris(8-quinolinolato)aluminum (III) (Alq) were vacuum-deposited.

5. A 0.5 nm electron-injecting layer of lithium fluoride was vacuum deposited onto the ETL, followed by a 150 nm layer of aluminum to form a cathode layer.

The above sequence completed the deposition of the OLED devices. The Comparative Devices 1 and 2 were left unencapsulated as comparisons.

The OLED devices without an encapsulation layer when lit showed a large number of dark spots. After storage in the humidity chamber, the devices could not be lit. Organic layers hydrolyzed, and the aluminum cathode layer oxidized and became transparent. The OLED devices without encapsulation showed rapid growth of dark spots. After 7 days, when stored in an ambient environment, the devices could not be lit.

Inventive Example 1

Various multilayers of a $Al_2O_3$/ZnO stack, wherein the number and thickness of the layers were varied were made and tested. The multilayer stacks were about 2000 Å in total thickness. The coating for these two inventive devices comprised the following combination of layers:

| | |
|---|---|
| $Al_2O_3$ | 120 Å |
| ZnO | 100 Å |
| $Al_2O_3$ | 100 Å |
| ZnO | 150 Å |
| $Al_2O_3$ | 200 Å |
| ZnO | 200 Å |
| $Al_2O_3$ | 1000 Å |

The results showed that the multilayered film stacks consisting of $Al_2O_3$ and ZnO layers exhibited less or no cracks, meaning that the stress was better accommodated by the multilayer film stacks.

It was also shown that the multilayered $Al_2O_3$/ZnO film stacks can provide good protection: two of the inventive devices exhibited no dark spot growth in the center of the OLED pixels (edge growth can be eliminated by optimization of the geometry and the flow rates) after 24 and 48 hours in a humidity chamber.

Inventive Example 2

An OLED device was coated with an encapsulation film containing a mixture of $Al_2O_3$/ZnO prepared by combining precursors for two oxides in the microchamber slots of a spatially dependent atomic layer deposition head, using water in another channel.

A total of 450 oscillation cycles of the delivery head was performed. During the coating process, a 120 Å layer of pure $Al_2O_3$ was first deposited. Then the flows of metal precursors to the trimethylaluminum bubbler flow and to the diethylzinc bubbler flow were gradually modified to increase the relative amount of ZnO and decrease the relative amount of $Al_2O_3$ until the film reached 100% of ZnO. Then the process was repeated in the opposite direction, diminishing the relative amount of ZnO while increasing the relative amount of $Al_2O_3$ such that the final 100 Å of material consisted of $Al_2O_3$ only. The total thickness of the mixed $Al_2O_3$/ZnO film was approximately 2000 Å.

After the coating process was completed, the voltage was applied to the electrodes and the dark spots were characterized. The device was then kept at 25 degrees C. and 50% RH for 7 days. During this period the device was repeatedly tested and demonstrated no or minimal growth of dark spots when lit. In comparison to the unencapsulated device kept in similar conditions, the mixed film of $Al_2O_3$ and ZnO provided significantly better protection against moisture and air.

The results showed that the film can be deposited crack-free or with lesser cracks. The mixed $Al_2O_3$/ZnO did not perform in the humidity chamber as well as the multilayer film stacks, supposedly because of the difficulty to control the composition in the current deposition system and elements of gas mixing, but the mixed $Al_2O_3$/ZnO film was still superior to the single $Al_2O_3$ or single ZnO film.

The invention has been described in detail with particular reference to certain preferred embodiments thereof, but it will be understood that variations and modifications can be effected within the spirit and scope of the invention.

| PARTS LIST | |
|---|---|
| 1 | continuous supply of gaseous materials for system |
| 2 | first channel flow of first molecular precursor over channel are of substrate |
| 3 | relative movement of substrate and multi-channel flows |
| 4 | second channel flow with inert gas over channel area |
| 5 | relative movement of substrate and multi-channel flows |
| 6 | third channel flow of second molecular precursor over channel area |
| 7 | relative movement of substrate and multi-channel flows |
| 8 | fourth channel flow with inert gas over channel area |
| 9 | relative movement of substrate and multi-channel flow |
| 10 | deposition device |
| 11 | multiple channel flow in parallel |
| 12 | output channel |
| 14, 16, 18 | gas inlet port |
| 15 | sequence |
| 20 | substrate |
| 22 | partition |
| 24 | gas output port |
| 26 | exhaust port |
| 28a, 28b, 28c | gas supply |
| 30 | actuator |
| 32 | supply line |
| 36 | output face |
| 38 | redirecting plate |
| 40 | aperture |
| 42 | partition plate |
| 44 | delivery plate |
| 46a, 46b, 46c | duct |
| 48 | redirecting chamber |
| 50 | chamber |
| 52 | transport motor |
| 54 | transport subsystem |
| 56 | control logic processor |
| 58 | baffle |
| 60 | Atomic Layer Deposition (ALD) process |
| 62 | web conveyor |
| 64 | deposition device transport |
| 66 | web substrate |
| 70 | Atomic Layer Deposition (ALD) process |
| 72 | diffusion layer |
| 74 | substrate support |
| 81 | nitrogen gas flow |
| 82, 83, 84 | gas bubbler |
| 85, 86, 87, 88 | flow meter |
| 89, 91, 94 | flow meter |
| 90 | air flow |
| 92 | metal precursor flow |
| 93 | oxidizer-containing flow |
| 95 | nitrogen purge flow |
| 96 | gap |
| 97 | example substrate |
| 98 | arrow |

-continued

PARTS LIST

| | |
|---|---|
| 108 | OLED device |
| 110 | substrate |
| 112 | first electrode |
| 114 | organic element layer |
| 116 | second, conductive electrode |
| 117 | thin film encapsulating package |
| 120 | cover |
| 126 | auxiliary electrode |
| 130 | thin film electronic components |
| 132 | planarization layers |
| 134 | via |
| 140R | color filter |
| 140G | color filter |
| 140B | color filter |
| 150 | light-emitting area |
| 152 | light-emitting area |
| 154 | light-emitting area |
| 160 | adhesive |
| D | distance |
| F1, F2, F3, F4 | gas flow |
| $F_I$, $F_O$, $F_M$, $F_E$ | gas flow |
| H | height |
| I | inert gaseous material |
| L | channel length |
| M | second reactant gaseous material |
| O | first reactant gaseous material |
| R | arrow |
| W | channel width |

The invention claimed is:

1. A process of encapsulating an electronic device with a thin film comprising:
providing an electronic device on a substrate;
providing a plurality of gaseous material sources including a first source of a first reactant gaseous material, a second source of a second reactant gaseous material, and a third source of a inert gaseous material;
providing a delivery head in fluid communication with the gaseous material sources through a plurality of inlet ports, the first gaseous material source being connected to a first inlet port, the second gaseous material source being connected to a second inlet port, the third gaseous material source being connected to a third inlet port, the delivery head including an output face and a first plurality of elongated substantially parallel emissive channels connected in fluid communication with the first inlet port, a second plurality of elongated substantially parallel emissive channels connected to the second inlet port, and a third plurality of elongated substantially parallel emissive channels connected to the third inlet port, at least one of the third elongated emissive channels being positioned to separate at least one of the first elongated emissive channels and at least one of the second elongated emissive channels;
causing one or more of the first reactant gaseous material, the second reactant gaseous material, and the inert gaseous material to flow through the first elongated emissive channel, the second elongated emissive channel, and the third elongated emissive channel, respectively, of the delivery head, the flow including a pressure, the pressure generated by the flow of the one or more of the first reactant gaseous material, the second reactant gaseous material, and the third inert gaseous materials creating a gas fluid bearing that maintains a substantially uniform distance between the output face of the delivery head and the substrate;
simultaneously directing the first reactant gaseous material, the second reactant gaseous material, and the inert gaseous material to flow through the first elongated emissive channel, the second elongated emissive channel, and the third elongated emissive channel, respectively, of the delivery head toward the electronic device and the substrate;
causing a relative motion between the delivery head and the substrate to cause the second reactant gaseous material to react with at least a portion of the electronic device and a portion of the substrate that has been treated with the first reactant gaseous material to create a thin film encapsulation package including a thin film over at least one of the portion of the electronic device and the portion of the substrate that has been treated with the first reactant gaseous material, the encapsulation package providing at least the electronic device with an environmental barrier layer.

2. The process of claim 1, wherein creating the gas fluid bearing includes causing the delivery head to float above the substrate.

3. The process of claim 1, wherein creating the gas fluid bearing includes causing the substrate to levitate above the delivery head.

4. The process of claim 1, the thin film of the encapsulation package being a first thin film, the process further comprising:
creating a second thin film of the encapsulation package over the first thin film by substituting one of the first reactant gaseous material and the second reactant gaseous material with a third reactant gaseous and repeating the process of claim 1.

5. The process of claim 1, the thin film of the encapsulation package being a first thin film, the process further comprising:
creating a second thin film of the encapsulation package over the first thin film by substituting the first reactant gaseous material with a third reactant gaseous material and substituting the second reactant gaseous material with a fourth reactant gaseous material and repeating the process of claim 1.

6. The process of claim 1, wherein one of the first reactant gaseous material and the second reactant gaseous material include a mixture of reactant gaseous materials that react with the other of the first reactant gaseous material and the second reactant gaseous material.

7. The process of claim 6, wherein the mixture of the reactant gaseous materials is varied during deposition.

8. The process of claim 1, wherein causing one or more of the first reactant gaseous material, the second reactant gaseous material, and the inert gaseous material to flow through the first elongated emissive channel, the second elongated emissive channel, and the third elongated emissive channel, respectively, of the delivery head; simultaneously directing the first reactant gaseous material, the second reactant gaseous material, and the inert gaseous material to flow through the first elongated emissive channel, the second elongated emissive channel, and the third elongated emissive channel, respectively, of the delivery head toward the electronic device and the substrate; and causing relative motion between the delivery head and the substrate to cause the second reactant gaseous material to react with at least a portion of the electronic device and a portion of the substrate that has been treated with the first reactant gaseous material occurs at or near atmospheric pressure.

9. The process of claim 8, wherein causing one or more of the first reactant gaseous material, the second reactant gaseous material, and the inert gaseous material to flow through the first elongated emissive channel, the second elongated emissive channel, and the third elongated emissive channel, respectively, of the delivery head; simultaneously directing the first reactant gaseous material, the second reactant gaseous material, and the inert gaseous material to flow through the first elongated emissive channel, the second elongated emissive channel, and the third elongated emissive channel, respectively, of the delivery head toward the electronic device and the substrate; and causing relative motion between the delivery head and the substrate to cause the second reactant gaseous material to react with at least a portion of the electronic device and a portion of the substrate that has been treated with the first reactant gaseous material occurs in an unsealed environment.

10. The process of claim 1, wherein causing one or more of the first reactant gaseous material, the second reactant gaseous material, and the inert gaseous material to flow through the first elongated emissive channel, the second elongated emissive channel, and the third elongated emissive channel, respectively, of the delivery head; simultaneously directing the first reactant gaseous material, the second reactant gaseous material, and the inert gaseous material to flow through the first elongated emissive channel, the second elongated emissive channel, and the third elongated emissive channel, respectively, of the delivery head toward the electronic device and the substrate; and causing relative motion between the delivery head and the substrate to cause the second reactant gaseous material to react with at least a portion of the electronic device and a portion of the substrate that has been treated with the first reactant gaseous material occurs in an unsealed environment.

* * * * *